(12) United States Patent
Kuwahara

(10) Patent No.: US 11,359,942 B2
(45) Date of Patent: Jun. 14, 2022

(54) HOLDING APPARATUS, INSPECTION SYSTEM, AND MOVEMENT METHOD

(71) Applicants: KABUSHIKI KAISHA TOSHIBA, Tokyo (JP); TOSHIBA ENERGY SYSTEMS & SOLUTIONS CORPORATION, Kawasaki (JP)

(72) Inventor: Hiroaki Kuwahara, Yokohama (JP)

(73) Assignees: KABUSHIKI KAISHA TOSHIBA, Tokyo (JP); TOSHIBA ENERGY SYSTEMS & SOLUTIONS CORPORATION, Kawasaki (JP)

(*) Notice: Subject to any disclaimer, the term of this patent is extended or adjusted under 35 U.S.C. 154(b) by 0 days.

(21) Appl. No.: 17/226,719

(22) Filed: Apr. 9, 2021

(65) Prior Publication Data

US 2021/0325211 A1    Oct. 21, 2021

(30) Foreign Application Priority Data

Apr. 20, 2020    (JP) .............................. JP2020-074888

(51) Int. Cl.
*G01D 11/02* (2006.01)
*G01D 11/30* (2006.01)
(Continued)

(52) U.S. Cl.
CPC .............. *G01D 11/30* (2013.01); *G01D 11/02* (2013.01); *G01D 11/16* (2013.01); *G01M 15/02* (2013.01)

(58) Field of Classification Search
CPC ........ G01D 11/30; G01D 11/02; G01D 11/16; G01M 15/02
See application file for complete search history.

(56) References Cited

U.S. PATENT DOCUMENTS

| 5,650,579 A | 7/1997 | Hatley et al. |
| 7,520,189 B2 | 4/2009 | Abbasi et al. |

(Continued)

FOREIGN PATENT DOCUMENTS

| JP | 4618247 B2 | 1/2011 |
| JP | 5750383 B2 | 7/2015 |

(Continued)

OTHER PUBLICATIONS

Toshiba Press Releases & News: "Toshiba Develops an Inspection Robot for Turbine Generators", Jul. 9, 2018, https://www.toshiba-energy.com/en/info/info2018_0709.htm, 6 pages.

(Continued)

*Primary Examiner* — Jamel E Williams
(74) *Attorney, Agent, or Firm* — Oblon, McClelland, Maier & Neustadt, L.L.P.

(57) ABSTRACT

According to one embodiment, a holding apparatus includes a holding mechanism, a movement mechanism, a measuring instrument, a detector, and a controller. The holding mechanism holds a mobile body. The mobile body is movable through a gap between first and second structure bodies. The first structure body is columnar and extends in a first direction. The second structure body is tubular and is located around the first structure body along a first plane perpendicular to the first direction. The movement mechanism moves the holding mechanism along a circumferential direction around the first direction. The measuring instrument measures a movement amount in the circumferential direction of the holding mechanism. The detector detects a tilt of the holding mechanism in the first plane. The controller operates the movement mechanism and moves the holding mechanism based on a measurement result of the measuring instrument and a detection result of the first detector.

20 Claims, 19 Drawing Sheets

(51) Int. Cl.
   *G01M 15/02*     (2006.01)
   *G01D 11/16*     (2006.01)

(56) References Cited

U.S. PATENT DOCUMENTS

| 2013/0047748 | A1* | 2/2013 | Visintin | G01M 7/00 |
| | | | | 73/862.381 |
| 2018/0128879 | A1* | 5/2018 | Kuwahara | G01R 31/44 |
| 2019/0130556 | A1* | 5/2019 | Kuwahara | G06T 7/0004 |
| 2020/0234429 | A1* | 7/2020 | Kuwahara | H02K 15/00 |

FOREIGN PATENT DOCUMENTS

| JP | 2018-75979 A | 5/2018 |
| JP | 2019-82455 A | 5/2019 |
| JP | 2019-171481 A | 10/2019 |
| JP | 2020-116657 A | 8/2020 |

OTHER PUBLICATIONS

Hiroaki Kuwahara, et al., "Robotic Inspection Technology Substantially Shortening Time Required for Turbine Generator Inspections", Toshiba Review, vol. 75, No. 6, Nov. 2020, 10 pages (with Machine Generated English Translation).

* cited by examiner

HOLDING APPARATUS, INSPECTION SYSTEM, AND MOVEMENT METHOD

CROSS-REFERENCE TO RELATED APPLICATIONS

This application is based upon and claims the benefit of priority from Japanese Patent Application No. 2020-074888, filed on Apr. 20, 2020; the entire contents of which are incorporated herein by reference.

FIELD

Embodiments described herein relate generally to a holding apparatus, an inspection system, and a movement method.

BACKGROUND

There is an inspection system that includes a mobile body moving on a structure body, and a holding apparatus that holds the mobile body. It is desirable to improve the performance of the holding apparatus and the inspection system.

DETAILED DESCRIPTION

Figure 1:
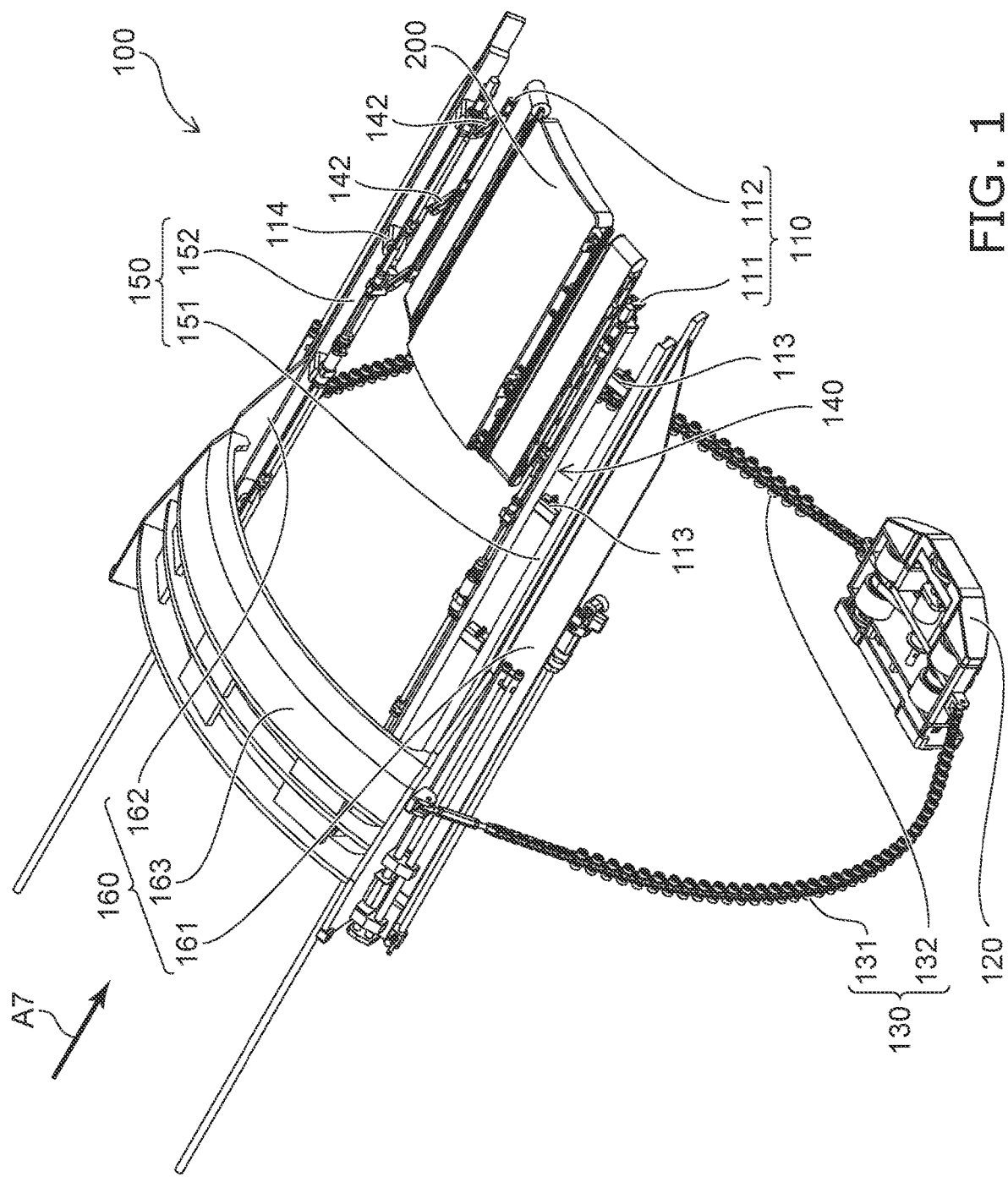
FIG. 1 is a perspective view illustrating a holding apparatus according to an embodiment.

According to one embodiment, a holding apparatus includes a holding mechanism, a movement mechanism, a first measuring instrument, a first detector, and a first controller. The holding mechanism holds a mobile body. The mobile body is movable through a gap between a first structure body and a second structure body. The first structure body is columnar and extends in a first direction. The second structure body is tubular and is located around the first structure body along a first plane perpendicular to the first direction. The movement mechanism moves the holding mechanism along a circumferential direction around the first direction. The first measuring instrument measures a movement amount in the circumferential direction of the holding mechanism. The first detector detects a tilt of the holding mechanism in the first plane. The first controller operates the movement mechanism and moves the holding mechanism based on a measurement result of the first measuring instrument and a detection result of the first detector.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

FIG. 1 is a perspective view illustrating a holding apparatus according to an embodiment.

Figure 2:
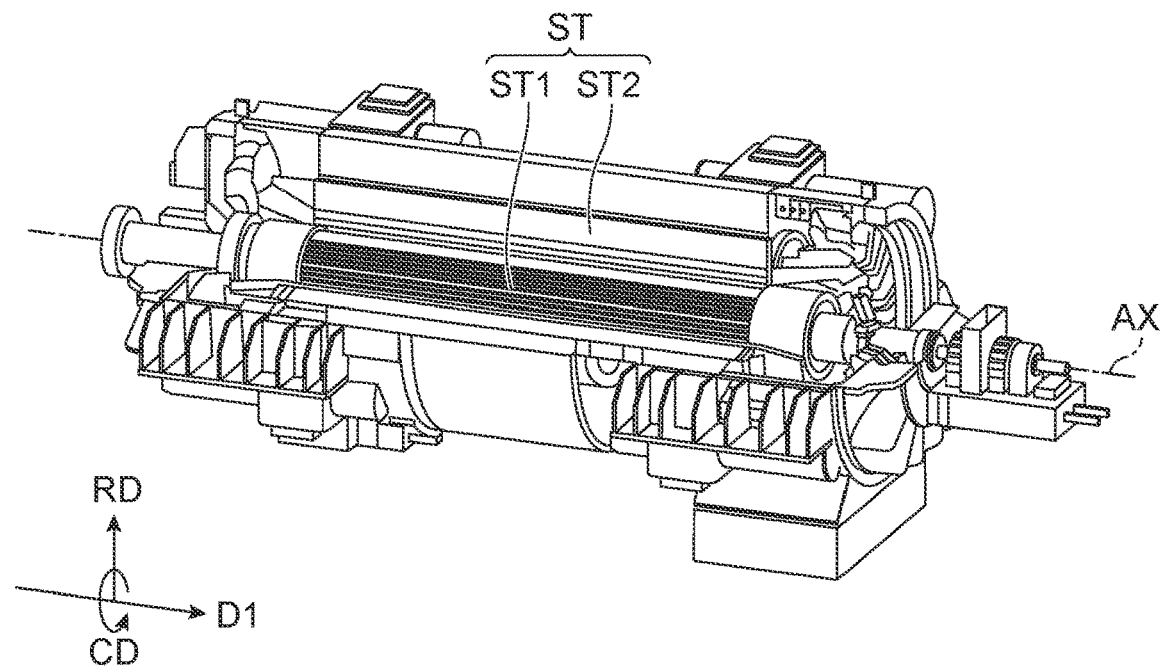
FIG. 2 is a perspective view illustrating an application example of the holding apparatus according to the embodiment.
Figure 3:
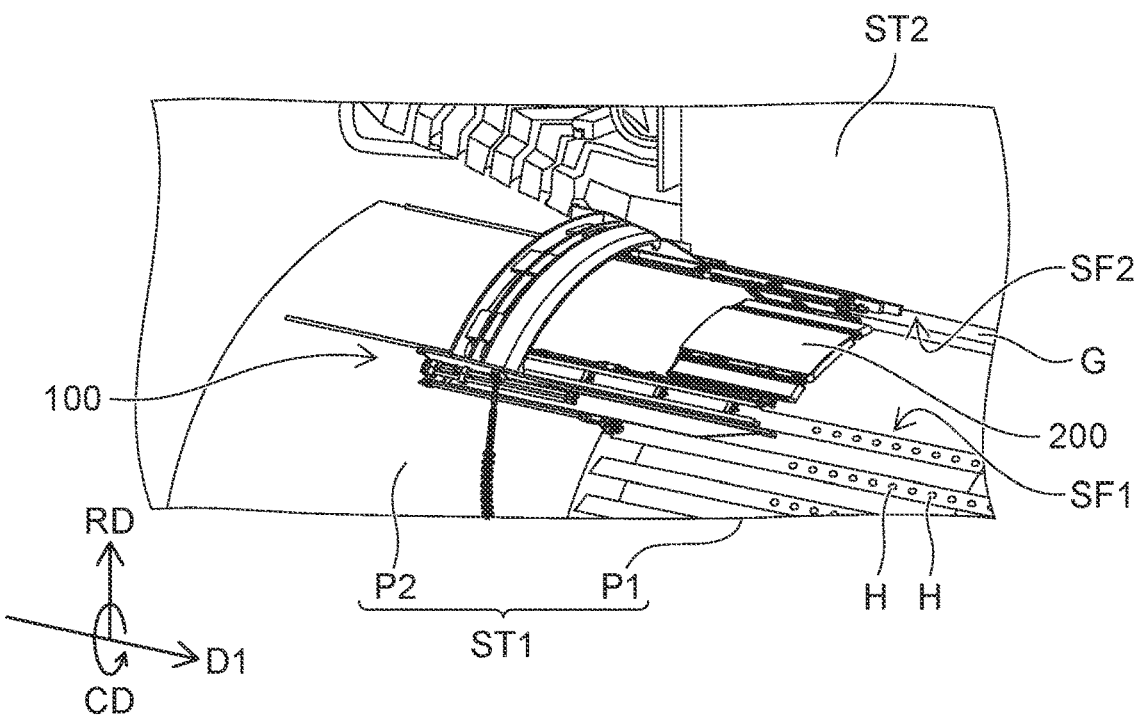
FIG. 3 is a perspective view illustrating an application example of the holding apparatus according to the embodiment.

FIGS. 2 and 3 are perspective views illustrating an application example of the holding apparatus according to the embodiment. FIG. 3 is an enlarged view of the broken line portion of FIG. 2.

As illustrated in FIG. 1, the holding apparatus 100 according to the embodiment is used in a task for a structure ST illustrated in FIG. 2. As illustrated in FIGS. 2 and 3, the structure ST includes a columnar first structure body ST1 and a tubular second structure body ST2. As illustrated in FIG. 3, the holding apparatus 100 is located in a gap G between the first structure body ST1 and the second structure body ST2.

The first structure body ST1 and the second structure body ST2 extend in a first direction D1. For example, the first direction D1 is along a horizontal plane. The second structure body ST2 is located around the first structure body ST1 along a first plane that is perpendicular to the first direction D1. The first structure body ST1 is, for example, circular columnar. The second structure body ST2 is, for example, circular tubular. For example, the first structure body ST1 is rotatable at the inner side of the second structure body ST2 with a rotation axis AX parallel to the first direction D1 as the center.

As illustrated in FIG. 3, the holding apparatus 100 is mounted to the first structure body ST1. The holding apparatus 100 is configured to hold a mobile body 200 that is located in the gap G. The holding apparatus 100 is movable along a circumferential direction CD around the first direction D1. The circumferential direction CD is parallel to the first plane that is perpendicular to the first direction D1.

The first structure body ST1 and the second structure body ST2 respectively include a first surface SF1 and a second surface SF2. The first surface SF1 and the second surface SF2 face each other in a diametrical direction RD that is perpendicular to the first direction D1 and the circumferential direction CD. In other words, the diametrical direction RD is the direction from the first structure body ST1 toward the second structure body ST2. The mobile body 200 moves along the first direction D1 along the first surface SF1 of the first structure body ST1 or the second surface SF2 of the second structure body ST2. In the example illustrated in FIG. 3, the mobile body 200 moves along the first surface SF1.

As illustrated in FIG. 3, the first structure body ST1 includes a first part P1 and a second part P2. The first part P1 and the second part P2 are arranged in the first direction D1. The length in the diametrical direction RD of the second part P2 is greater than the length in the diametrical direction RD of the first part P1. A step exists between the first part P1 and the second part P2. For example, the second part P2 is positioned at an end portion in the first direction D1 of the first structure body ST1.

A specific configuration of the holding apparatus 100 will now be described.

Figure 4:
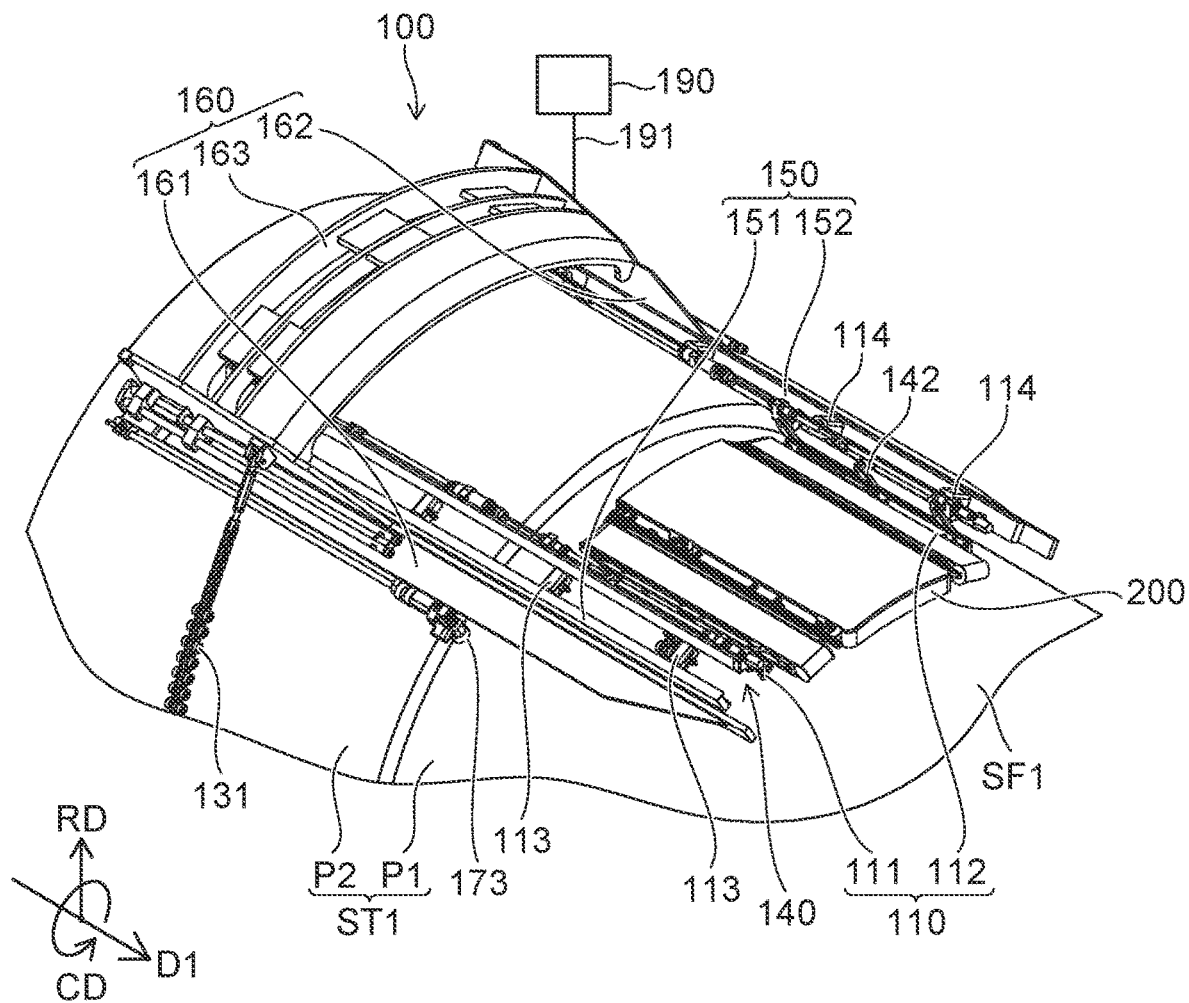
FIG. 4 is a perspective view illustrating the holding apparatus according to the embodiment.
Figure 5:
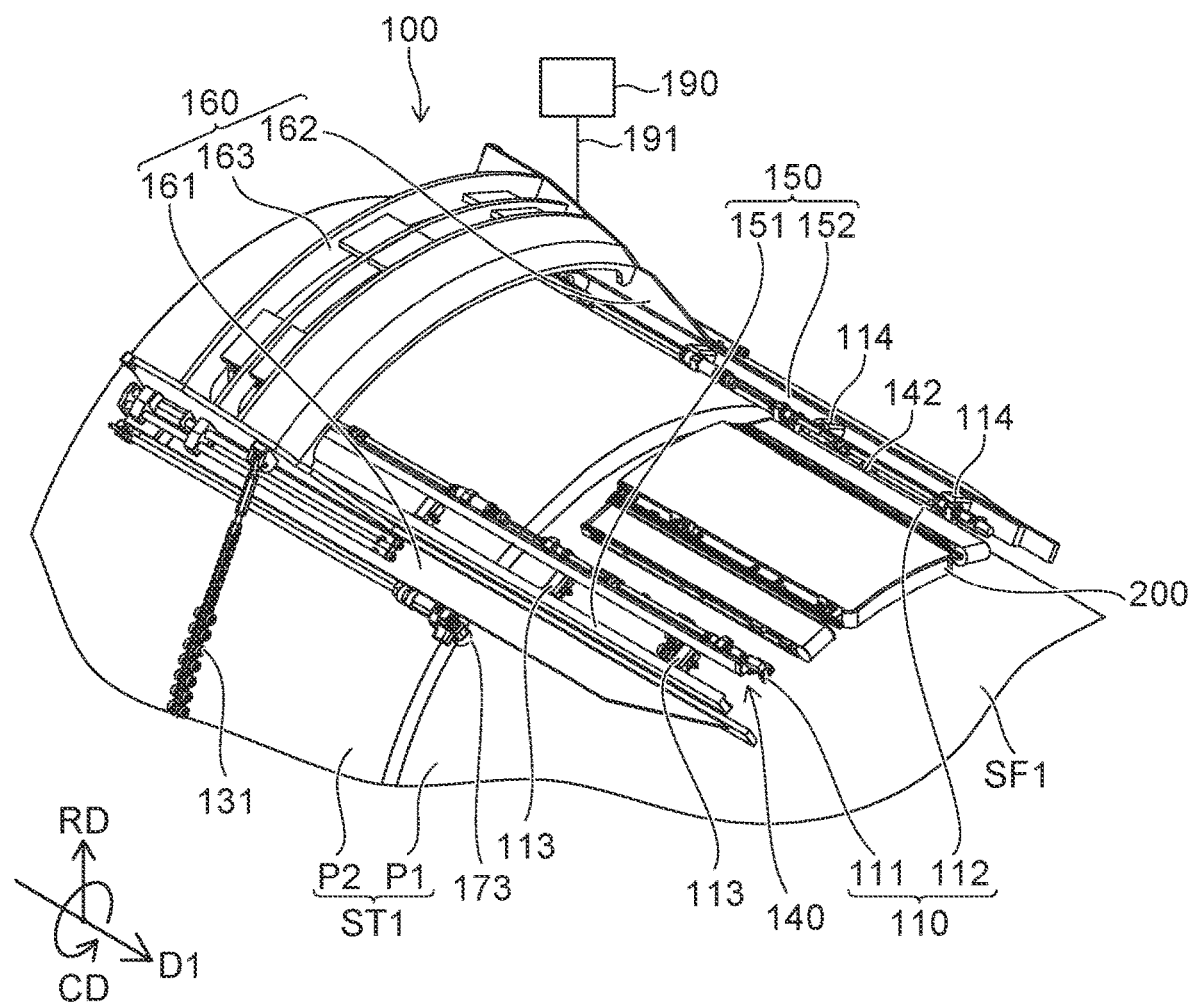
FIG. 5 is a perspective view illustrating the holding apparatus according to the embodiment.

FIGS. 4 and 5 are perspective views illustrating the holding apparatus according to the embodiment.

Figure 6:
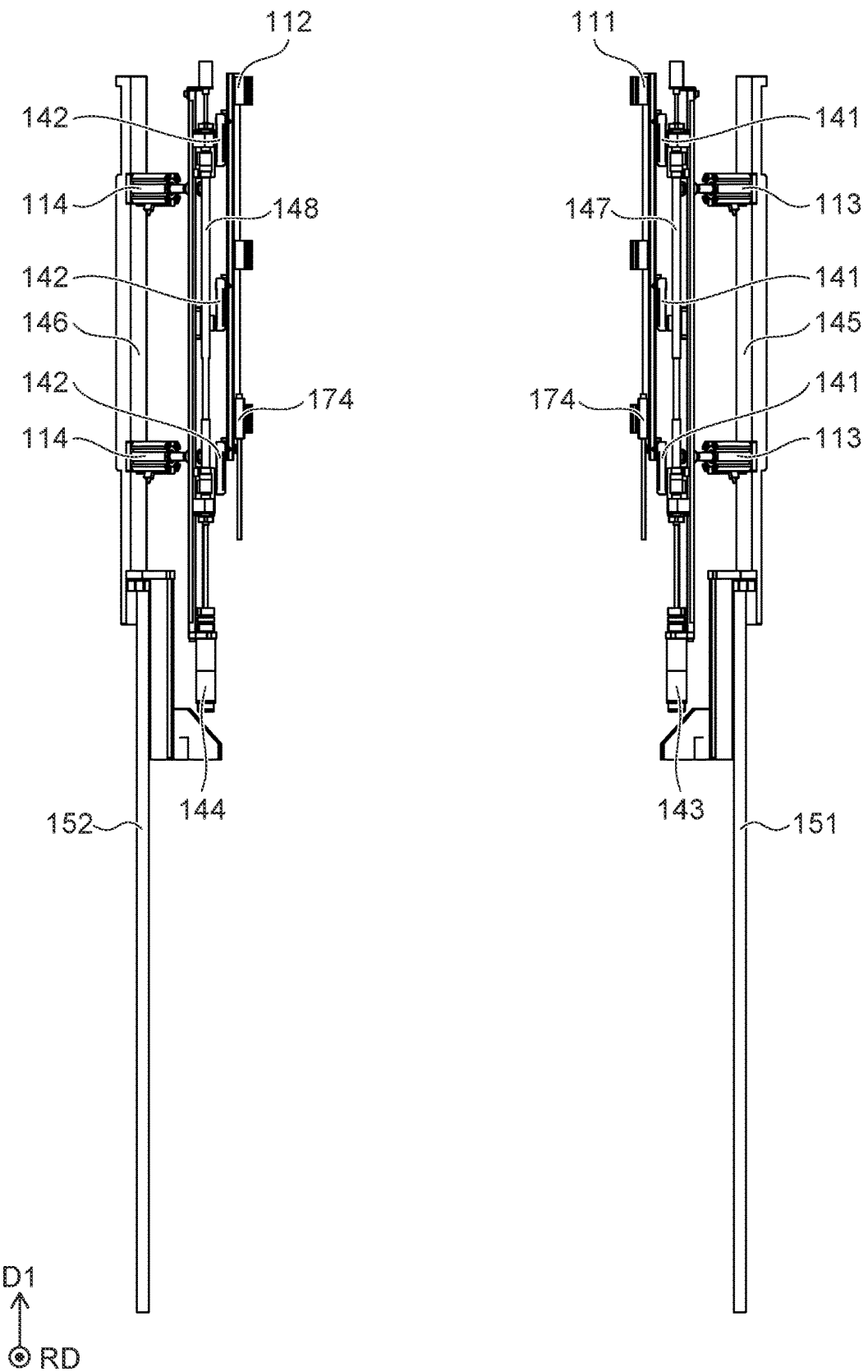
FIG. 6 is a plan view illustrating portions of the holding apparatus according to the embodiment.

FIG. 6 is a plan view illustrating portions of the holding apparatus according to the embodiment.

Figure 7:
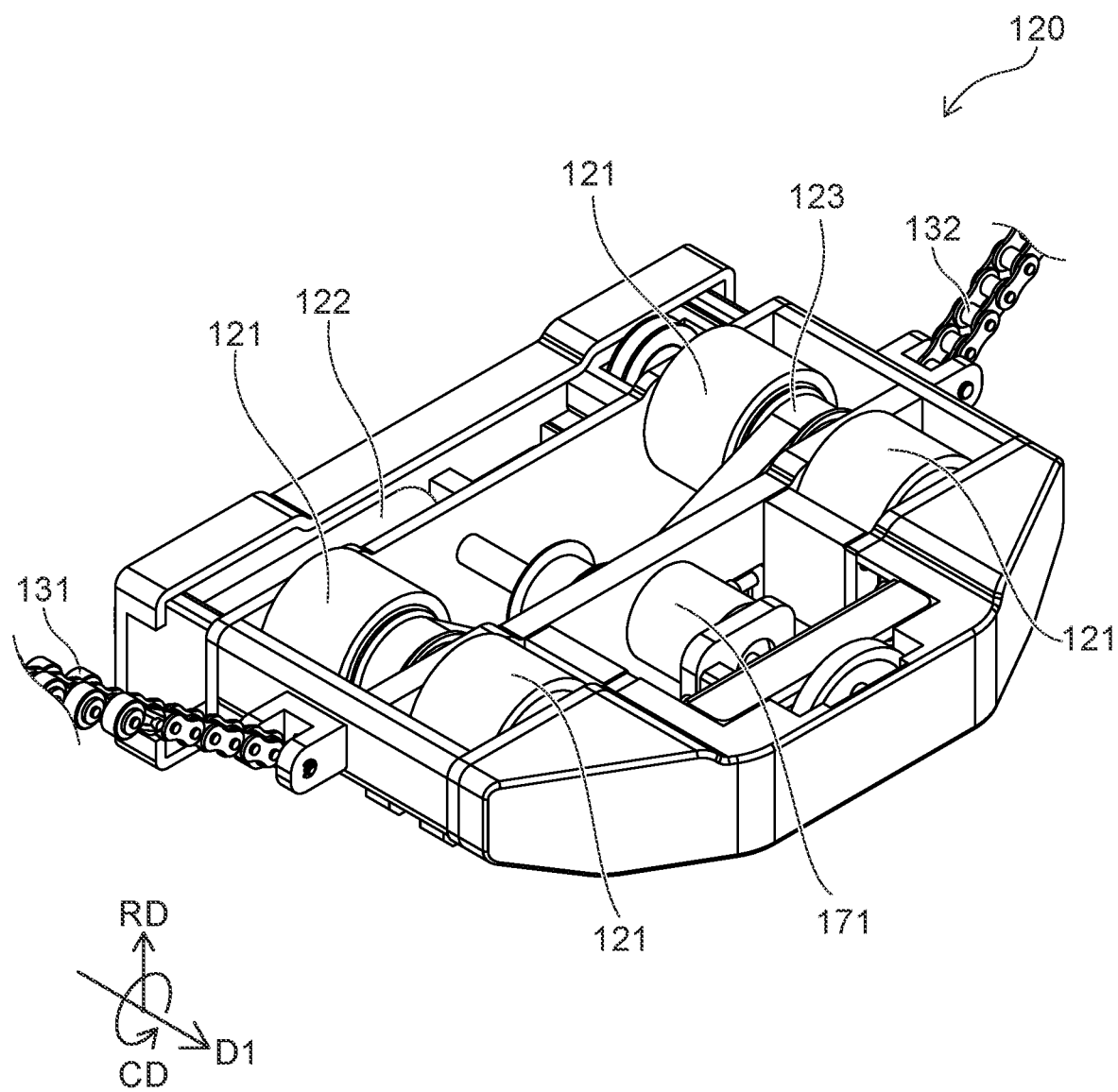
FIG. 7 is a perspective view illustrating a portion of the holding apparatus according to the embodiment.

FIG. 7 is a perspective view illustrating a portion of the holding apparatus according to the embodiment.

As illustrated in FIGS. 1, 4, and 5, the holding apparatus 100 includes a holding mechanism 110, a movement mechanism 120, a mounting part 130, a raising/lowering mechanism 140, a sliding mechanism 150, a frame 160, and a controller 190 (a first controller).

The holding mechanism 110 holds the mobile body 200. Specifically, as illustrated in FIGS. 1, 4, and 5, the holding mechanism 110 includes a first holder 111 and a second holder 112. The first holder 111 and the second holder 112 are separated from each other in the circumferential direction CD. The first holder 111 and the second holder 112 hold the end portions in the circumferential direction CD of the mobile body 200.

As illustrated in FIG. 6, the first holder 111 is a U-shaped member that is open toward the second holder 112. Similarly, the second holder 112 is a U-shaped member that is open toward the first holder 111. The first holder 111 and the second holder 112 face each other in the circumferential direction CD. The first holder 111 and the second holder 112 extend along the first direction D1.

The first holder 111 is connected to a driver 113. The second holder 112 is connected to a driver 114. The drivers 113 and 114 respectively move the first holder 111 and the second holder 112 along the circumferential direction CD. The drivers 113 and 114 may respectively include actuators. As illustrated in FIG. 5, the drivers 113 and 114 move the first holder 111 and the second holder 112 toward the mobile body 200 when the mobile body 200 is positioned between the first holder 111 and the second holder 112. The first holder 111 and the second holder 112 engage the end portions in the circumferential direction CD of the mobile body 200. As illustrated in FIG. 4, the mobile body 200 is held thereby.

The movement mechanism 120 moves the holding mechanism 110 along the circumferential direction CD. For example, the movement mechanism 120 operates in a state in which the holding mechanism 110 holds the mobile body 200. Thereby, the mobile body 200 can be moved along the circumferential direction CD.

As illustrated in FIGS. 1 and 7, the movement mechanism 120 includes a roller 121 and a driver 122. The roller 121 contacts the first surface SF1 of the first structure body ST1. The roller 121 is directly or indirectly connected with the driver 122. The driver 122 is, for example, a motor. The roller 121 rotates when the driver 122 drives. The holding mechanism 110 and the movement mechanism 120 are moved along the circumferential direction CD on the first surface SF1 by the rotation of the roller 121.

For example, multiple rollers 121 are arranged in the first direction D1 and the circumferential direction CD. The rotation shafts of the pair of rollers 121 arranged in the first direction D1 are fixed to each other. The rollers 121 that are arranged in the circumferential direction CD are coupled to each other by a belt 123. When any of the rollers 121 is rotated by the driver 122, the other rollers 121 also are rotated thereby. In other words, in the movement mechanism 120, multiple drive wheels are arranged in the first direction D1 and the circumferential direction CD.

By arranging the multiple rollers 121 in the first direction D1, the contact area between the first structure body ST1 and the rollers 121 can be increased while downsizing the rollers 121. By arranging the multiple rollers 121 in the first direction D1, even when one roller 121 does not contact the first surface SF1 due to an unevenness of the first surface SF1, the other rollers 121 can be caused to contact the first surface SF1 as drive wheels. The likelihood of the holding apparatus 100 no longer being able to move in the circumferential direction CD due to an unevenness of the first surface SF1 can be reduced thereby.

The movement mechanism 120 may be mounted to the frame 160 or may be located at a position that is separated from the holding mechanism 110 and the frame 160 as illustrated in FIG. 1. For example, the movement mechanism 120 is located at a position facing the holding mechanism 110 and the frame 160 with the first structure body ST1 interposed. The mounting part 130 is directly or indirectly connected to the holding mechanism 110 and is wound around the first structure body ST1 along the circumferential direction CD. The holding mechanism 110 is mounted to the first structure body ST1 via the mounting part 130. In the example illustrated in FIG. 1, the mounting part 130 includes a band-shaped first coupler 131 and a band-shaped second coupler 132. The movement mechanism 120 is included in a portion of the mounting part 130.

The first coupler 131 and the second coupler 132 couple the movement mechanism 120 and the frame 160. The second coupler 132 is located at a position facing the first coupler 131 with the first structure body ST1 interposed. The holding mechanism 110, the movement mechanism 120, the first coupler 131, and the second coupler 132 are located around the first structure body ST1 along the first plane that is perpendicular to the first direction D1.

The first coupler 131 and the second coupler 132 are wound without slack. The holding mechanism 110 is pulled via the first coupler 131 or the second coupler 132 when the movement mechanism 120 moves. The position in the circumferential direction CD of the holding mechanism 110 is changed thereby.

When the movement mechanism 120 is mounted to the frame 160, the mounting part 130 may be one band-shaped member wound on the first structure body ST1. In such a case, the holding mechanism 110 and the movement mechanism 120 are mounted to the first structure body ST1 via the mounting part 130. For example, the movement mechanism 120 moves along the mounting part 130 in the circumferential direction CD along the first surface SF1.

The raising/lowering mechanism 140 raises or lowers the holding mechanism 110 with respect to the frame 160. For example, the raising/lowering mechanism 140 raises the holding mechanism 110 from the first structure body ST1 toward the second structure body ST2. Or, the raising/lowering mechanism 140 lowers the holding mechanism 110 from the second structure body ST2 toward the first structure body ST1. The position in the diametrical direction RD of the holding mechanism 110 is changed thereby. FIGS. 4 and 5 illustrate the state in which the holding mechanism 110 is lowered and is in contact with the first surface SF1.

Specifically, as illustrated in FIG. 6, the raising/lowering mechanism 140 includes links 141 and 142, drivers 143 and 144, fixed bars 145 and 146, and rotating rods 147 and 148. The fixed bars 145 and 146 are respectively fixed to one end of the driver 113 and one end of the driver 114. One end of each of the links 141 and 142 is rotatably provided with respect to the fixed bar 145 or 146.

The fixed bars 145 and 146 and the rotating rods 147 and 148 extend along the first direction D1. The rotating rods 147 and 148 are connected respectively to the drivers 143 and 144. The drivers 143 and 144 rotate the rotating rods 147 and 148 around the first direction D1.

One end of each of the links 141 and 142 is connected with the rotating rod 147 or 148 via a not-illustrated conversion member. The directions of the rotational motions of the rotating rods 147 and 148 around the first direction D1 are converted to motions around the circumferential direction CD by not-illustrated conversion members. The links 141 and 142 are rotated around the circumferential direction CD with respect to the fixed bars 145 and 146 by the converted driving forces.

Pluralities of the links 141 and 142 are arranged along the first direction D1. The multiple links 141 are simultaneously rotated by the operation of the driver 143. The multiple links 142 are simultaneously rotated by the operation of the driver 144.

The other end of each of the links 141 is pivotably mounted to the first holder 111. The other end of each of the links 142 is pivotably mounted to the second holder 112. In other words, the links 141 and 142 are rotatable with respect to the first and second holders 111 and 112. The positions in the diametrical direction RD of the first and second holders 111 and 112 are changed by the links 141 and 142 rotating with respect to the fixed bars 145 and 146.

The sliding mechanism 150 slides along the first direction D1. The raising/lowering mechanism 140 is connected to the sliding mechanism 150. The holding mechanism 110 and the raising/lowering mechanism 140 are moved along the first direction D1 with respect to the frame 160 by the sliding mechanism 150.

As illustrated in FIG. 1 and FIGS. 4 to 6, the sliding mechanism 150 includes a sliding part 151 and a sliding part 152. The sliding parts 151 and 152 are separated from each other in the circumferential direction CD. The sliding parts 151 and 152 move along the first direction D1 at the same timing.

The fixed bar 145 is connected to the sliding part 151 via the driver 113. The fixed bar 146 is connected to the sliding part 152 via the driver 114. The drivers 143 and 144 change the positions in the diametrical direction RD of the first and second holders 111 and 112 with respect to the sliding parts 151 and 152. The drivers 113 and 114 move the first holder 111 that is connected with the fixed bar 145 and the second holder 112 that is connected with the fixed bar 146 along the circumferential direction CD with respect to the sliding parts 151 and 152.

The frame 160 includes a base frame 161, a base frame 162, and a coupling frame 163. The base frames 161 and 162 are separated from each other in the circumferential direction CD. The coupling frame 163 couples the base frames 161 and 162 to fix the positional relationship of the base frames 161 and 162.

The sliding part 151 is connected to the base frame 161. The sliding part 152 is connected to the base frame 162. The sliding parts 151 and 152 are driven by not-illustrated actuators and slide in the first direction D1 respectively with respect to the base frames 161 and 162.

The base frame 161 is coupled to the movement mechanism 120 via the first coupler 131. The base frame 162 is coupled to the movement mechanism 120 via the second coupler 132. The holding mechanism 110 is connected with the movement mechanism 120 via the first coupler 131, the second coupler 132, the raising/lowering mechanism 140, the sliding mechanism 150, and the frame 160.

The position in the circumferential direction CD of the holding mechanism 110 changes when the movement mechanism 120 operates and the frame 160 is moved along the circumferential direction CD. The position in the diametrical direction RD of the holding mechanism 110 changes when the raising/lowering mechanism 140 operates. When the sliding mechanism 150 operates, the raising/lowering mechanism 140 is moved along the first direction D1, and the position in the first direction D1 of the holding mechanism 110 changes. The position of the mobile body 200 in each direction can be changed by the movement mechanism 120, the raising/lowering mechanism 140, and the sliding mechanism 150 operating while the holding mechanism 110 holds the mobile body 200.

Figure 8:
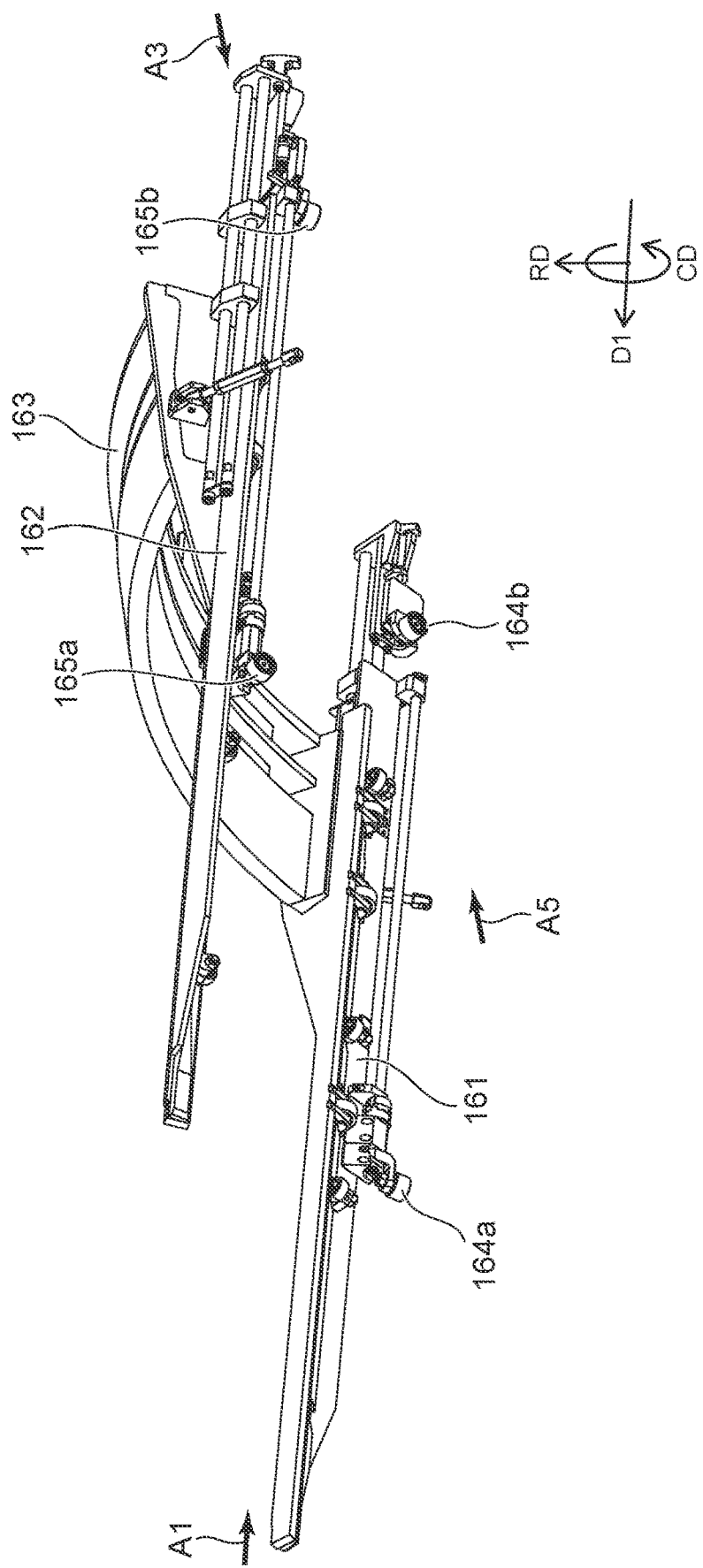
FIG. 8 is a perspective view illustrating the holding apparatus according to the embodiment.

FIG. 8 is a perspective view illustrating the holding apparatus according to the embodiment. Some of the components of the holding apparatus 100 are not illustrated in FIG. 8.

As illustrated in FIG. 8, the frame 160 may include rollers 164a (an example of a first roller), 164b (an example of a second roller), 165a (another example of the first roller), and 165b (another example of the second roller).

The rollers 164a and 164b are mounted to the base frame 161 and are separated from each other in the first direction D1. The roller 164a is located frontward of the roller 164b. The rollers 165a and 165b are mounted to the base frame 162 and are separated from each other in the first direction D1. The roller 165a is located frontward of the roller 165b. Here, frontward refers to the direction from the second part P2 toward the first part P1 of the first structure body ST1. Backward is the reverse direction of frontward. The rollers 164a and 165a are separated from each other in the circumferential direction CD. The rollers 164b and 165b are separated from each other in the circumferential direction CD.

As described above, a step exists between the first part P1 and the second part P2 in the first structure body ST1. The rollers 164a and 165a catch on the step. The rollers 164b and 165b contact the end surface in the first direction D1 of the first structure body ST1. A portion of the second part P2 is squeezed between the rollers 164a and 164b and between the rollers 165a and 165b. The fluctuation of the position of the holding apparatus 100 is suppressed thereby. The rollers 164a, 164b, 165a, and 165b rotate while contacting the first structure body ST1 when the frame 160 is moved by the operation of the movement mechanism 120.

FIGS. 9A and 9B and FIGS. 10A and 10B are side views illustrating portions of the holding apparatus according to the embodiment.

Figure 9A:
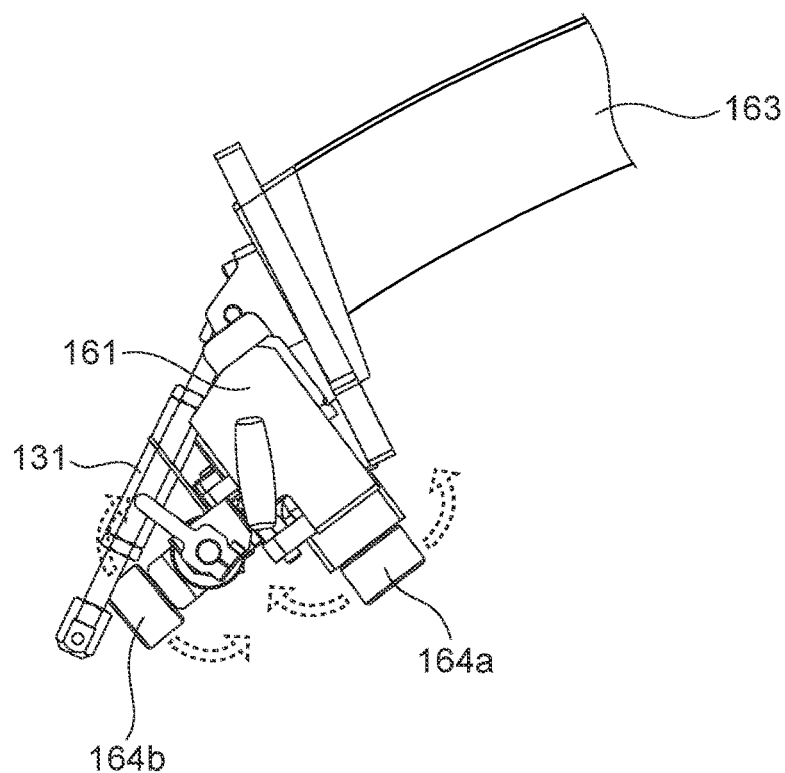
FIGS. 9A and 9B are side views illustrating portions of the holding apparatus according to the embodiment.
Figure 9B:
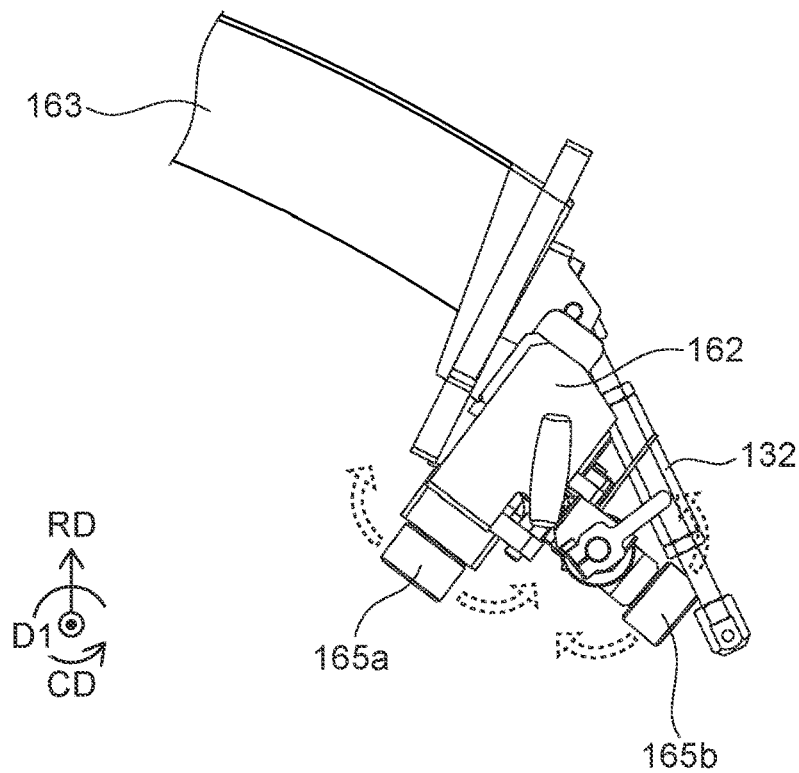
Figure 10A:
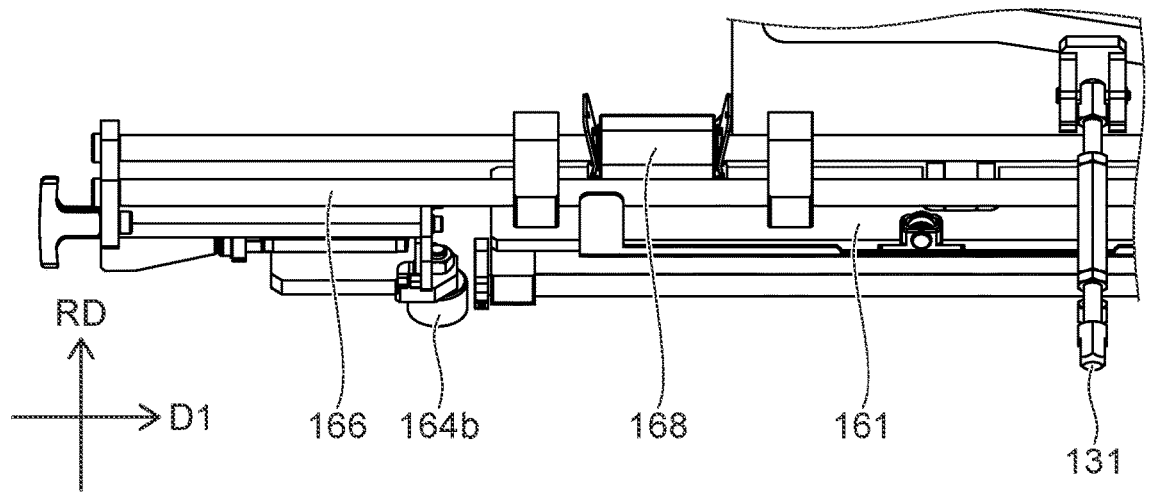
FIGS. 10A and 10B are side views illustrating portions of the holding apparatus according to the embodiment.
Figure 10B:
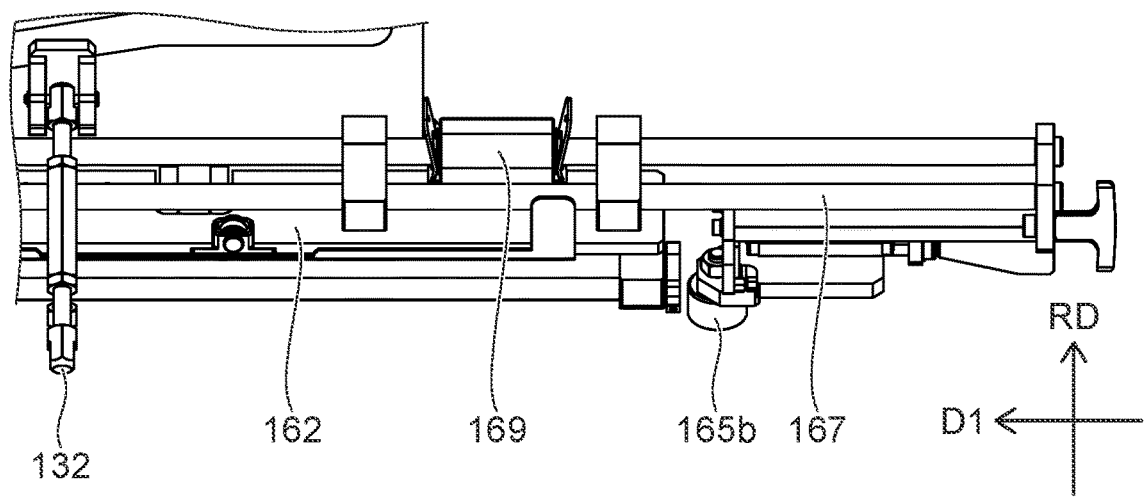

FIGS. 9A and 9B illustrate the state when portions of the holding apparatus 100 are viewed from the direction of arrow A1 shown in FIG. 8. FIGS. 10A and 10B illustrate the state of portions of the holding apparatus 100 when viewed respectively from the direction of arrows A3 and A5 shown in FIG. 8.

As illustrated by the broken line arrows in FIG. 9A, the rollers 164a and 164b are rotatable with respect to the base frame 161. As illustrated in FIG. 9B, the rollers 165a and 165b are rotatable with respect to the base frame 162. The rotation-axis directions of the rollers 164a, 164b, 165a, and 165b with respect to the base frames 161 and 162 are along the first direction D1. In other words, the rollers 164a, 164b, 165a, and 165b rotate around the first direction D1 with respect to the base frames 161 and 162.

As illustrated in FIGS. 3 to 5, the first surface SF1 is curved. It is favorable for the rotation-axis directions of the rollers 164a, 164b, 165a, and 165b to be parallel to the normal direction of the first surface SF1 so that the frame 160 can smoothly move on the first surface SF1. The rollers 164a, 164b, 165a, and 165b are rotated with respect to the base frames 161 and 162 according to the curvature of the first surface SF1. Thereby, the holding apparatus 100 is applicable to multiple first structure bodies ST1 having mutually-different curvatures of the first surface SF1.

As illustrated in FIG. 10A, the roller 164b is connected to the base frame 161 via a rod-shaped sliding part 166. As illustrated in FIG. 10B, the roller 165b is connected to the base frame 162 via a rod-shaped sliding part 167. Air cylinders 168 and 169 are connected respectively to the sliding parts 166 and 167. The sliding parts 166 and 167 slide along the first direction D1 with respect to the base frames 161 and 162 due to the driving of the air cylinders 168 and 169. To suppress unintended fluctuation of the position of the holding apparatus 100, it is favorable for the portion of the second part P2 to be sufficiently strongly squeezed between the rollers 164a and 164b and the rollers 165a and 165b.

For example, when the holding apparatus 100 is mounted to the second part P2, initially, the rollers 164a and 164b and the rollers 165a and 165b are rotated with respect to the base frames 161 and 162. The rotation axes of each are set to be parallel to the normal direction of the first surface SF1. Then, the rollers 164a and 165a are caused to catch on the step between the first surface SF1 and the second surface SF2. Continuing, the rollers 164b and 165b are moved toward the first structure body ST1 by sliding the sliding parts 166 and 167.

The rollers 164b and 165b are sufficiently strongly pressed toward the first structure body ST1. Thus, a portion of the second part P2 is squeezed by the rollers 164a and 164b and the rollers 165a and 165b; and the holding apparatus 100 is mounted to the second part P2.

The controller 190 includes a central processing unit (CPU) that includes a processing circuit. The controller 190 controls the operations of the components of the holding apparatus 100. For example, the controller 190 is located outside the structure ST and is connected with the components by a cable 191. Or, the controller 190 may be mounted to the frame 160.

An example of the structure of the mobile body 200 will now be described.

Figure 11:
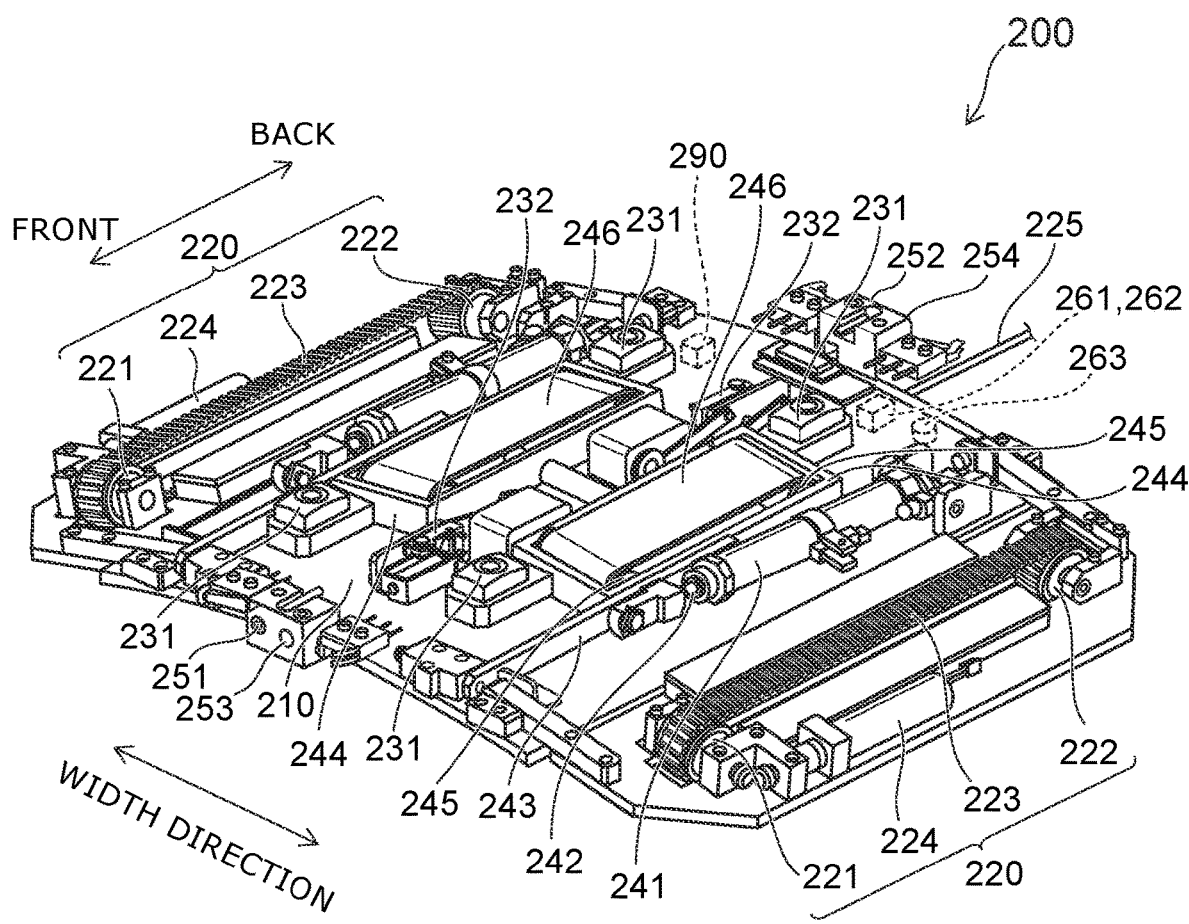
FIG. 11 is a perspective view illustrating a mobile body of an inspection system according to an embodiment.

FIG. 11 is a perspective view illustrating the mobile body of an inspection system according to an embodiment.

Figure 12:
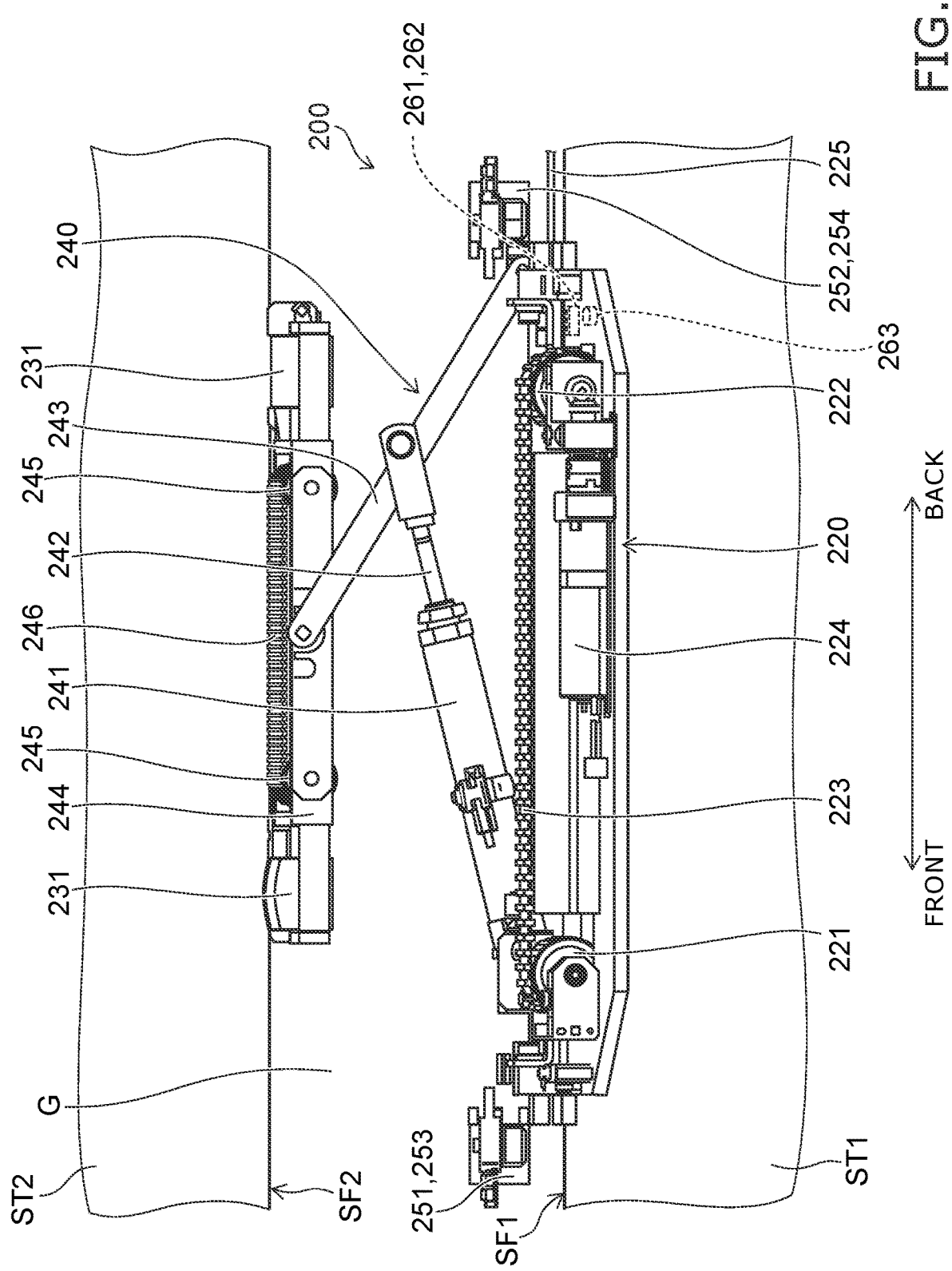
FIG. 12 is a side view illustrating the mobile body of the inspection system according to the embodiment.

FIG. 12 is a side view illustrating the mobile body of the inspection system according to the embodiment.

As illustrated in FIGS. 11 and 12, the mobile body 200 includes a base plate 210, multiple mobile mechanisms 220, an inspection part 231, an inspection part 232, a raising/lowering mechanism 240, an imager 251, an imager 252, an illuminator 253, an illuminator 254, and a controller 290.

The base plate 210 is curved along the first surface SF1 or the second surface SF2. The multiple mobile mechanisms 220 are separated from each other in a width direction that is perpendicular to the longitudinal direction. The mobile mechanisms 220 each include a pair of pulleys 221 and 222, a belt 223, and a motor 224.

The pulleys 221 and 222 are separated from each other in the longitudinal direction. The belt 223 lays over the pulleys 221 and 222. The belt 223 is exposed below the base plate 210 at the lower surface side (the first structure body ST1 side) of the base plate 210. For example, the motor 224 is connected to the pulley 221 and rotates the pulley 221. The mobile body 200 is moved by the belt 223 being driven by the rotation of the pulley 221. The movement direction of the mobile body 200 can be controlled by adjusting the rotation amount of the pulley 221 of one mobile mechanism 220 and the rotation amount of the pulley 221 of another mobile mechanism 220.

The inspection parts 231 and 232 are located on the base plate 210. For example, four inspection parts 231 are separated from each other in the longitudinal direction and the width direction; and two inspection parts 232 are separated from each other in the longitudinal direction. For example, the inspection part 231 includes one selected from an electric sensor, an acoustic emission (AE) sensor, or a mechanical sensor. The inspection part 232 includes another one selected from an electric sensor, an AE sensor, or a mechanical sensor.

For example, the inspection part 231 includes an electromagnetic core imperfection detector (EL-CID) sensor. The inspection part 232 includes an AE sensor, a hammer, and a hammer driver. The mobile body 200 inspects the first structure body ST1 or the second structure body ST2 by using the inspection parts 231 and 232 while moving along the first surface SF1 or the second surface SF2.

The raising/lowering mechanism 240 includes an air cylinder 241, a rod 242, an arm 243, a raising/lowering plate 244, a roller 245, and a belt 246. The rod 242 of the air cylinder 241 is connected to the arm 243. One end of the arm 243 is pivotably mounted to the base plate 210. The other end of the arm 243 is pivotably mounted to the raising/lowering plate 244. The rod 242 is pivotably mounted to a part between the one end and the other end of the arm 243. When the rod 242 extends due to the driving of the air cylinder 241, the other end of the arm 243 rotates with the one end as a fulcrum as illustrated in FIG. 12. The position in the diametrical direction RD of the raising/lowering plate 244 is changed thereby.

A pair of raising/lowering plates 244 is arranged in the width direction. The inspection part 231, the inspection part 232, the pair of rollers 245, and the belt 246 are provided in each of the raising/lowering plates 244. The pair of rollers 245 is separated from each other in the longitudinal direction. The belt 246 lays over these rollers 245.

The belt 246 contacts the first surface SF1 or the second surface SF2 when the raising/lowering plate 244 is raised in the direction away from the base plate 210. When the mobile body 200 moves along one of the first surface SF1 or the second surface SF2, the belt 246 is pressed onto the other of the first surface SF1 or the second surface SF2. The base plate 210 is pressed onto the one of the first surface SF1 or the second surface SF2 by the reaction force on the raising/lowering plate 244 from the other of the first surface SF1 or the second surface SF2. Thereby, the mobile body 200 can move along the one of the first surface SF1 or the second surface SF2 regardless of the direction of gravity.

The imager 251 and the illuminator 253 are located at the front of the base plate 210. The imager 252 and the illuminator 254 are located at the back of the base plate 210. The imagers 251 and 252 respectively image frontward and backward of the mobile body 200. The illuminators 253 and 254 respectively illuminate frontward and backward of the mobile body 200.

The controller 290 includes a CPU that includes a processing circuit. The controller 290 controls the operations of the components of the mobile body 200. For example, the controller 290 inspects the first structure body ST1 or the second structure body ST2 by using the inspection parts 231 and 232. The controller 290 controls the travel direction of the mobile body 200 based on images acquired by the imagers 251 and 252. For example, the controller 290 adjusts the rotation amounts of the pair of motors 224 so that the mobile body 200 moves along the first direction D1.

A cable 225 is connected to the base plate 210. The cable 225 includes a power supply cable. The components of the mobile body 200 are driven by electrical power supplied via the cable 225.

The cable 225 may include a communication cable; and data may be transmitted and received between the controllers 190 and 290 via the communication cable. Or, the data may be transmitted and received via wireless communication between the controllers 190 and 290. The mobile body 200 may not include the controller 290; and the controller 190 may control the operation of the mobile body 200 by transmitting the data via a communication cable or wireless communication. In other words, the controller 190 may include the function of the controller 290.

The holding apparatus 100 may further include a measuring instrument 171 (a first measuring instrument), a detector 172 (a first detector), a detector 173 (a second detector), and a detector 174 (a third detector).

The measuring instrument 171 illustrated in FIG. 7 measures the movement amount in the circumferential direction CD of the holding mechanism 110. The measuring instrument 171 includes, for example, an encoder. When the holding mechanism 110 moves along the circumferential direction CD, a roller that contacts the first surface SF1 rotates. The measuring instrument 171 measures the movement amount of the holding mechanism 110 based on the rotation angle of the roller. For example, the measuring instrument 171 is located in the movement mechanism 120. The movement amount of the movement mechanism 120 corresponds to the movement amount of the holding mechanism 110. The measuring instrument 171 indirectly measures the movement amount of the holding mechanism 110 based on the movement amount of the movement mechanism 120. Or, the measuring instrument 171 may measure the movement amount of the holding mechanism 110 more directly by being located in the frame 160, etc.

The measuring instrument 171 may include an angular velocity sensor. In such a case, the measuring instrument 171 measures the movement amount of the holding mechanism 110 based on the detected angular velocity. The angular velocity sensor may detect the angular velocity of the holding mechanism 110 or may detect the angular velocity of the movement mechanism 120.

Figure 13:
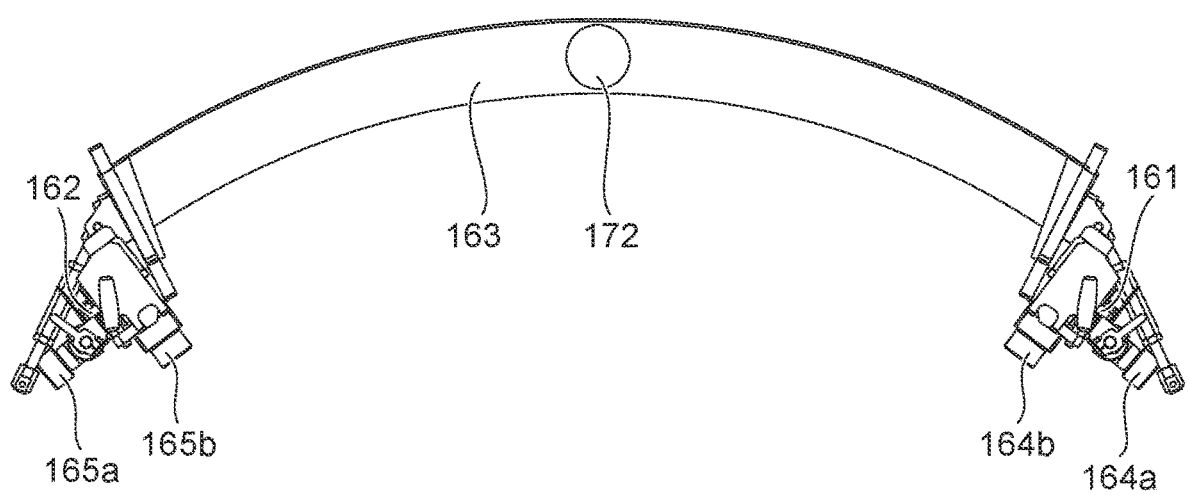
FIG. 13 is a back view illustrating the holding apparatus according to the embodiment.
Figure 13:

FIG. 13 is a back view illustrating the holding apparatus according to the embodiment. FIG. 13 illustrates the state when the holding apparatus 100 is viewed from the direction of arrow A7 shown in FIG. 1.

The detector 172 illustrated in FIG. 13 detects the tilt of the holding mechanism 110 in the first plane that is perpendicular to the first direction D1. The detector 172 includes, for example, a clinometer. The detector 172 detects the tilt with respect to the vertical direction of the holding mechanism 110.

In the example illustrated in FIG. 13, the detector 172 is located in the coupling frame 163. The tilt with respect to the vertical direction of the detector 172 is equal to the tilt with respect to the vertical direction of the holding mechanism 110. The detection result of the detector 172 directly indicates the tilt with respect to the vertical direction of the holding mechanism 110. Or, the tilt of the holding mechanism 110 may be indirectly detected. For example, the detector 172 may be located in the movement mechanism 120 and may detect the tilt of the movement mechanism 120. The controller 190 calculates the tilt of the holding mechanism 110 based on the detection result of the tilt and the positional relationship of the holding mechanism 110 and the movement mechanism 120.

The detector 172 may include an imaging device. In such a case, the imaging device images the holding mechanism 110 from the first direction D1. The detector 172 detects the tilt of the holding mechanism 110 based on the obtained image.

Figure 14A:
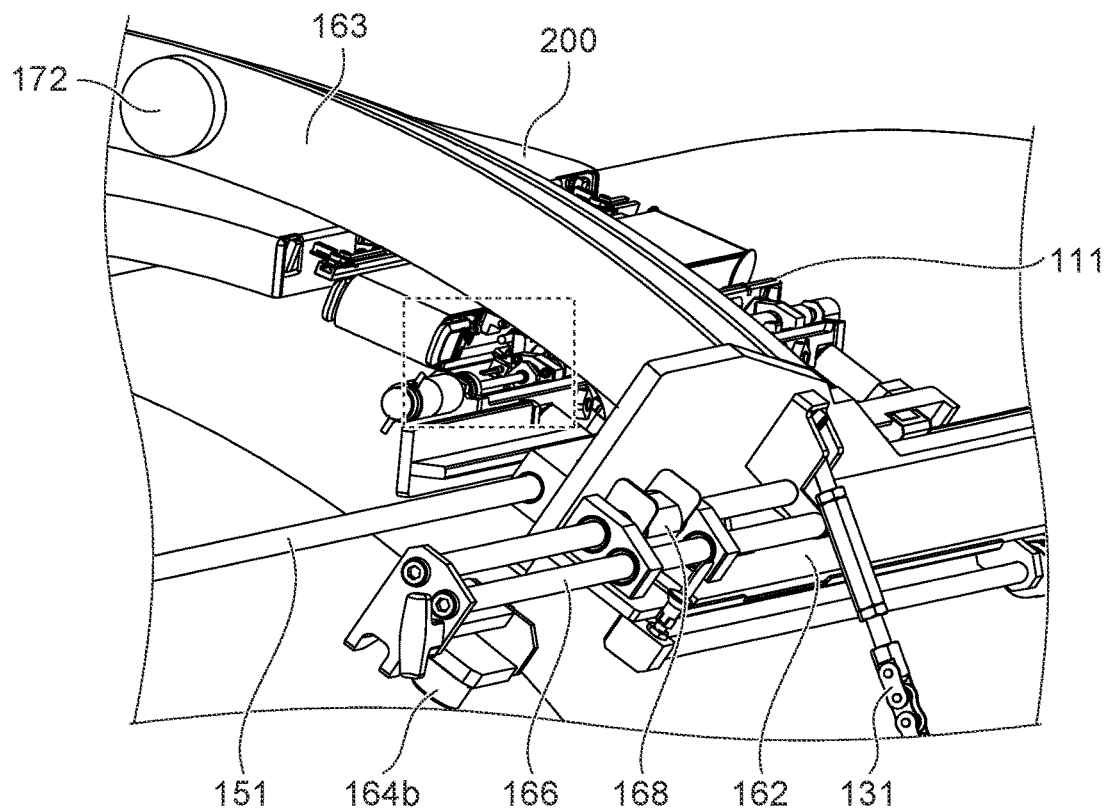
FIGS. 14A and 14B are perspective views illustrating a portion of the holding apparatus according to the embodiment.
Figure 14B:
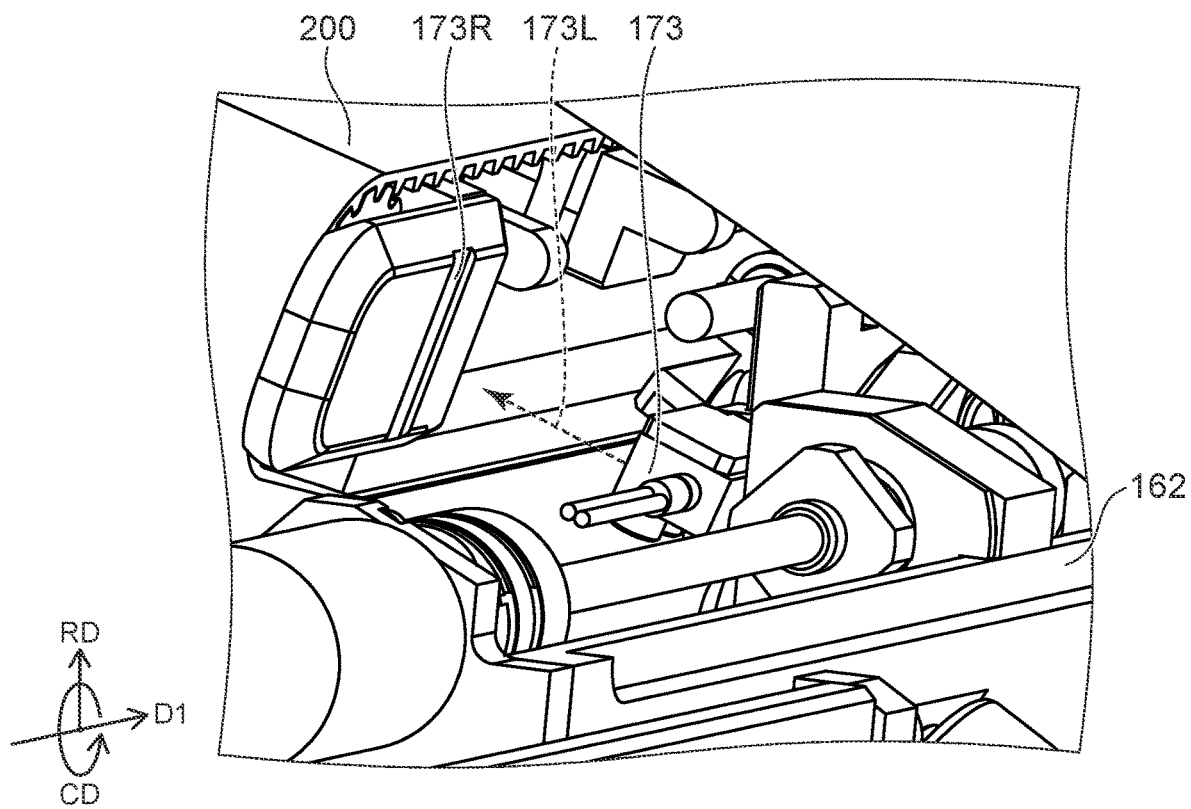

FIG. 14A is a perspective view illustrating a portion of the holding apparatus according to the embodiment. FIG. 14B is an enlarged view of the broken line portion of FIG. 14A.

The detector 173 illustrated in FIGS. 14A and 14B detects when the mobile body 200 is at a prescribed position with respect to the holding mechanism 110. The detector 173 includes, for example, a photoelectric sensor. As illustrated in FIG. 14B, the detector 173 irradiates light 173L from a light projector and uses a photodetector to detect the reflected light.

For example, a recess 173R is provided as a marker in a portion of the mobile body 200. In the example illustrated in FIG. 14B, the color of the recess 173R and the color of the other parts are different from each other. The detector 173 emits the light 173L toward the mobile body 200. When the mobile body 200 moves along the first direction D1 and the light 173L strikes the recess 173R, the intensity of the reflected light changes compared to when the light 173L strikes the other parts. The detector 173 detects that the mobile body 200 is at the prescribed position with respect to the holding mechanism 110 based on the intensity change of the reflected light.

The detector 174 detects the position in the circumferential direction CD of the mobile body 200 with respect to the holding mechanism 110. The detector 174 includes, for example, an imager.

The imager images the mobile body 200 and acquires an image. The position in the circumferential direction CD of the mobile body 200 inside the image is dependent on the difference between the position in the circumferential direction CD of the holding mechanism 110 (the frame 160) and the position in the circumferential direction CD of the mobile body 200. For example, the reference position in the circumferential direction CD of the mobile body 200 is stored in not-illustrated memory. The difference is zero when the mobile body 200 inside the image is at the reference position. The detector 174 detects the position in the circumferential direction CD of the mobile body 200 with respect to the holding mechanism 110 based on the difference between the reference position and the position of the mobile body 200 inside the image.

For example, as illustrated in FIG. 6, a pair of detectors 174 is fixed respectively to the first and second holders 111 and 112. The detectors 174 detect the position in the circumferential direction CD of the mobile body 200 with respect to the holding mechanism 110. For example, the controller 190 calculates the position in the circumferential direction CD of the mobile body 200 with respect to the holding mechanism 110 by averaging the detection results of the detectors 174.

As illustrated in FIGS. 11 and 12, the mobile body 200 may include a measuring instrument 261, a detector 262 (a fourth detector), and an imager 263.

The measuring instrument 261 measures the movement amount in the first direction D1 of the mobile body 200. The measuring instrument 261 includes, for example, an encoder. A roller is provided at the surface of the mobile body 200 at the first structure body ST1 side. The measuring instrument 261 measures the movement amount of the mobile body 200 based on the rotation angle of the roller that rotates according to the movement of the mobile body 200. The measuring instrument 261 may include an acceleration sensor or an angular velocity sensor and may measure the movement amount based on the detected acceleration or angular velocity.

The detector 262 detects the ground contact of the mobile body 200. Ground contact refers to a state in which the mobile body 200 contacts some surface and can move on the surface. The detector 262 detects the contact of the mobile body 200 with the first surface SF1 when the mobile body 200 moves along the first surface SF1. The detector 262 detects the contact of the mobile body 200 with the second surface SF2 when the mobile body 200 moves along the second surface SF2.

For example, the detector 262 includes a switch. When the mobile body 200 is grounded, a roller that has a rotation angle measured by the measuring instrument 261 is pressed toward the base plate 210. The magnetic field, capacitance, or current that is detected by the switch changes according to the displacement of the roller. The detector 262 detects the ground contact of the mobile body 200 based on the change. The detector 262 is not limited to the example illustrated in FIGS. 10A to 11; the detector 262 may be provided separately from the measuring instrument 261. For example, a button may be provided at the surface of the mobile body 200 at the first structure body ST1 side. The button is pressed toward the base plate 210 when the mobile body 200 contacts some surface. The detector 262 determines the ground contact of the mobile body 200 by detecting the displacement of the measuring instrument 261.

The imager 263 images the first surface SF1 or the second surface SF2. For example, as illustrated in FIG. 3, multiple holes H are provided in the first part P1 of the first structure body ST1. The multiple holes H are arranged along the first direction D1 and the circumferential direction CD. The imager 263 images the holes H. For example, the controller 290 determines whether or not an abnormality such as plugging or the like exists in the holes H based on the image acquired by the imager 263.

A method for inspecting the structure ST using the inspection system that includes the holding apparatus 100 and the mobile body 200 will now be described.

Figure 15:
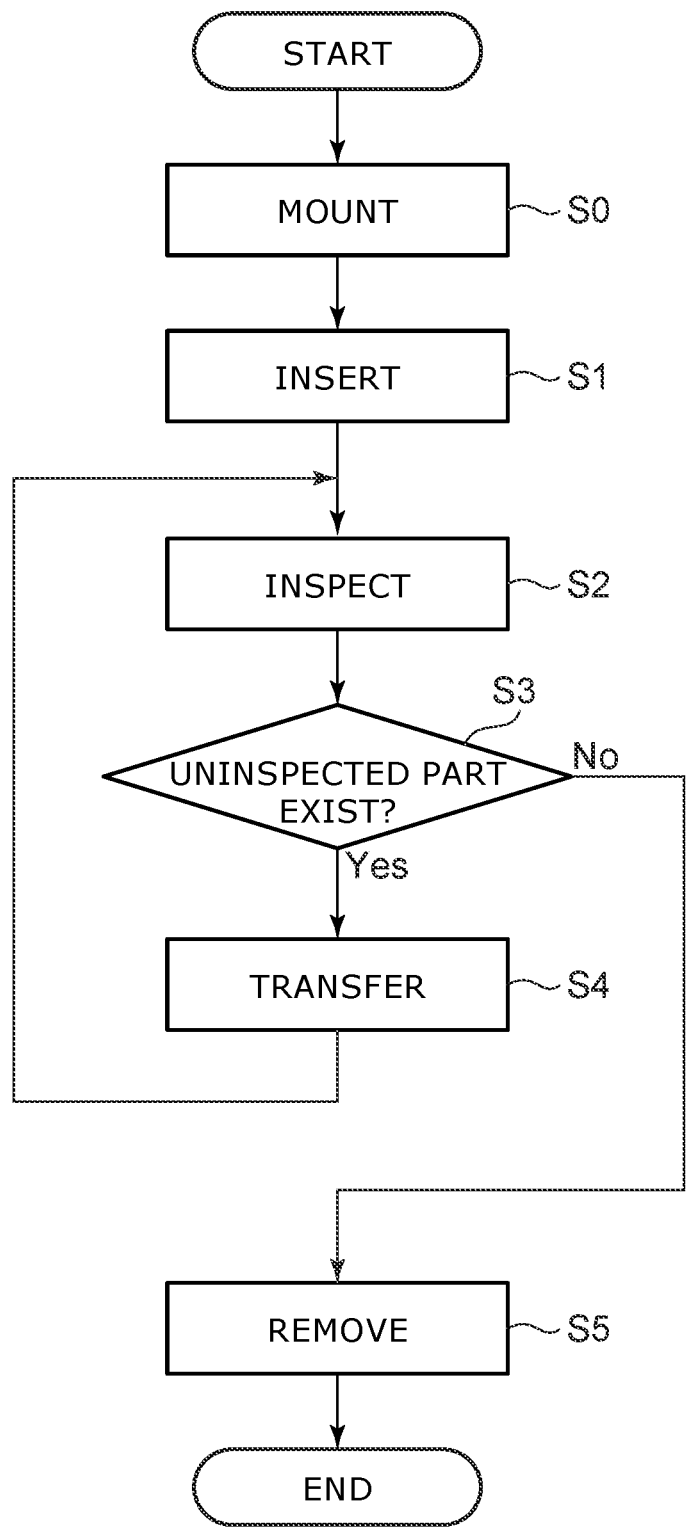
FIG. 15 is a flowchart illustrating an operation of the inspection system according to the embodiment.

FIG. 15 is a flowchart illustrating an operation of the inspection system according to the embodiment.

First, the holding apparatus 100 is mounted to the second part P2 of the first structure body ST1 (step S0). The mobile body 200 is inserted into the gap G by using the holding apparatus 100 (step S1). The mobile body 200 moves through the gap G along the first direction D1 and inspects the first structure body ST1 or the second structure body ST2 (step S2). The controller 190 determines whether or not an uninspected part exists (step S3). When an uninspected part exists, the holding apparatus 100 transfers the mobile body 200 so that the mobile body 200 is arranged with that part in the first direction D1 (step S4). When an uninspected part does not exist and when the inspection is completed, the mobile body 200 is removed from the gap G by using the holding apparatus 100 (step S5).

Figure 16:
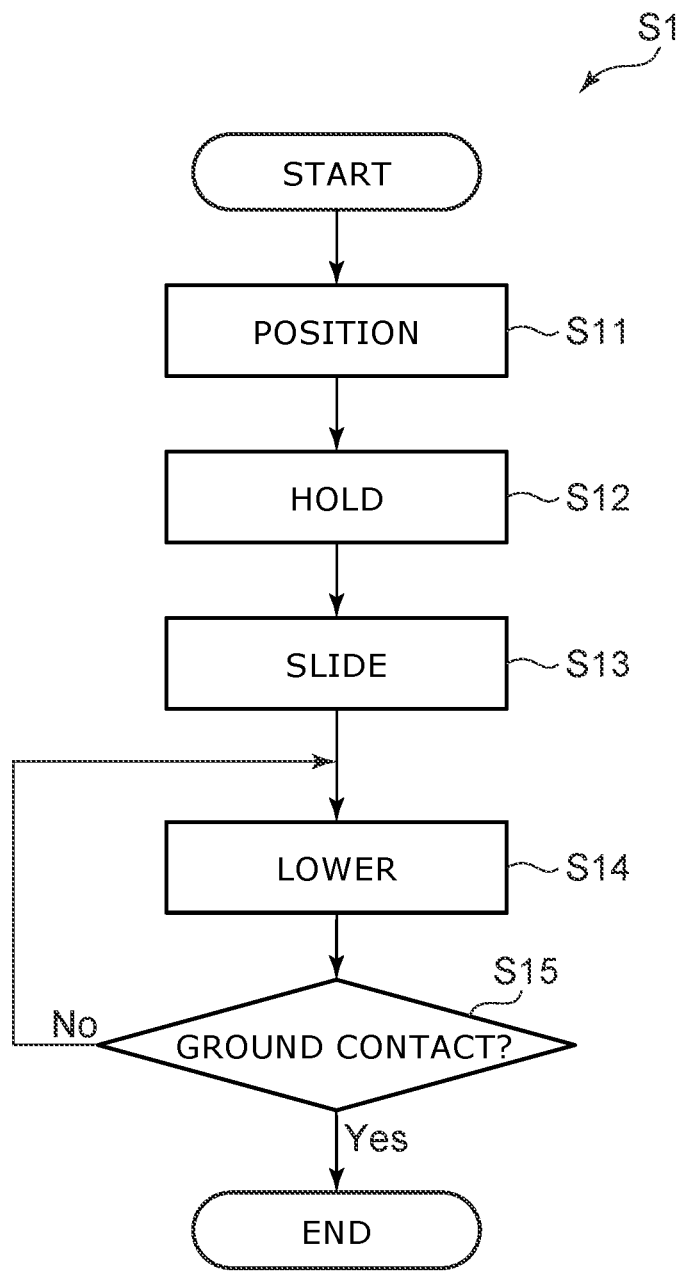
FIG. 16 is a flowchart that elaborates step S1 of FIG. 15.

FIG. 16 is a flowchart that elaborates step S1 of FIG. 15.

First, a human grips the mobile body 200 and positions the mobile body 200 between the first holder 111 and the second holder 112 (step S11). At this time, the raising/lowering mechanism 140 is in a state in which the holding mechanism 110 is raised. The sliding mechanism 150 positions the holding mechanism 110 at the end portion side of the first structure body ST1. Thereby, the mobile body 200 is easily inserted into the holding apparatus 100. The mobile body 200 is positioned so that the marker is detected by the detector 173.

The holding mechanism 110 holds the mobile body 200 (step S12). The sliding mechanism 150 slides toward the first part P1 and moves the holding mechanism 110 (step S13). The raising/lowering mechanism 140 lowers the holding mechanism 110 (step S14). At this time, the controller 290 determines whether or not the ground contact of the mobile body 200 is detected by the detector 262 (step S15). The raising/lowering mechanism 140 lowers the holding mechanism 110 until the ground contact of the mobile body 200 is detected.

Figure 17:
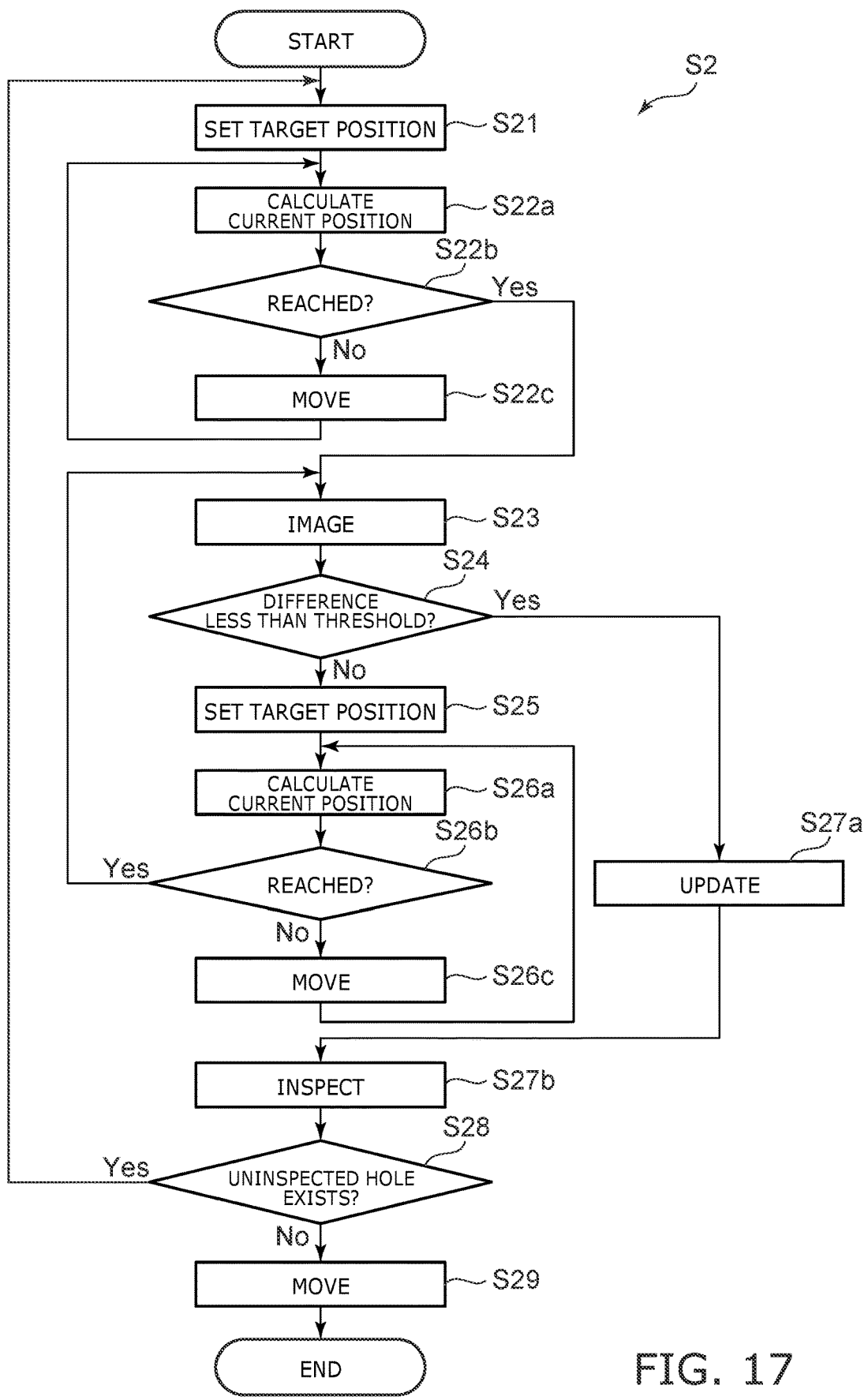
FIG. 17 is a flowchart that elaborates step S2 of FIG. 15.

FIG. 17 is a flowchart that elaborates step S2 of FIG. 15.

After ground contact, the mobile body 200 moves along the first direction D1 toward the hole H. Specifically, the controller 290 accesses not-illustrated memory and acquires the position in the first direction D1 of the hole H to be inspected. The controller 290 sets the position as the target position (step S21). The controller 290 acquires the current movement amount from the measuring instrument 261 and calculates the current position (step S22a). The controller 290 determines whether or not the target position has been reached (step S22b). For example, it is determined that the mobile body 200 has reached the target position when the difference between the current movement amount and the target position is less than a prescribed threshold. When the mobile body 200 has not reached the target position, the controller 290 drives the motor 224 and moves the mobile body 200 toward the target position (step S22c).

When it is determined in step S22b that the mobile body 200 has reached the target position, the controller 290 stops the mobile body 200. The imager 263 images the surface in which the hole H is provided to acquire the image of the hole H (step S23). The controller 290 calculates the difference between a prescribed reference position and the position of the hole H inside the image. The reference position refers to the position at which the hole H exists inside the image when the mobile body 200 has accurately moved to the position in the first direction D1 of the hole H and acquired the image at the position. The controller 290 compares the difference between the reference position and the position of the hole H inside the image to a prescribed threshold (step S24).

The mobile body 200 is moved to correct the difference when the difference is greater than the threshold. Specifically, the controller 290 sets the reference position as the target position by using the position of the hole H inside the image as the starting point (step S25). The controller 290 acquires the current movement amount from the measuring instrument 261 and calculates the current position (step S26a). The controller 290 determines whether or not the target position has been reached (step S26b). For example, it is determined that the mobile body 200 has reached the target position when the difference between the current movement amount and the target position is less than a prescribed threshold. When the mobile body 200 has not reached the target position, the controller 290 drives the motor 224 and moves the mobile body 200 toward the target position (step S26c). When it is determined that the mobile body 200 has reached the hole H, the controller 290 stops the mobile body 200 and re-perform step S23.

When the difference is determined to be less than the threshold in step S24, the controller 290 updates the position in the first direction of the imaged hole H as the current position in the first direction D1 of the mobile body 200 (step S27a). The controller 290 inspects whether or not the hole H is abnormal based on the image (step S27b). The controller 290 determines whether or not an uninspected hole H exists (step S28). When an uninspected hole H exists, step S21 is re-performed for the hole H. When an uninspected hole H does not exist, the mobile body 200 ends the determination of step S28 and moves along the first direction D1 toward the holding apparatus 100 (step S29).

Figure 18:
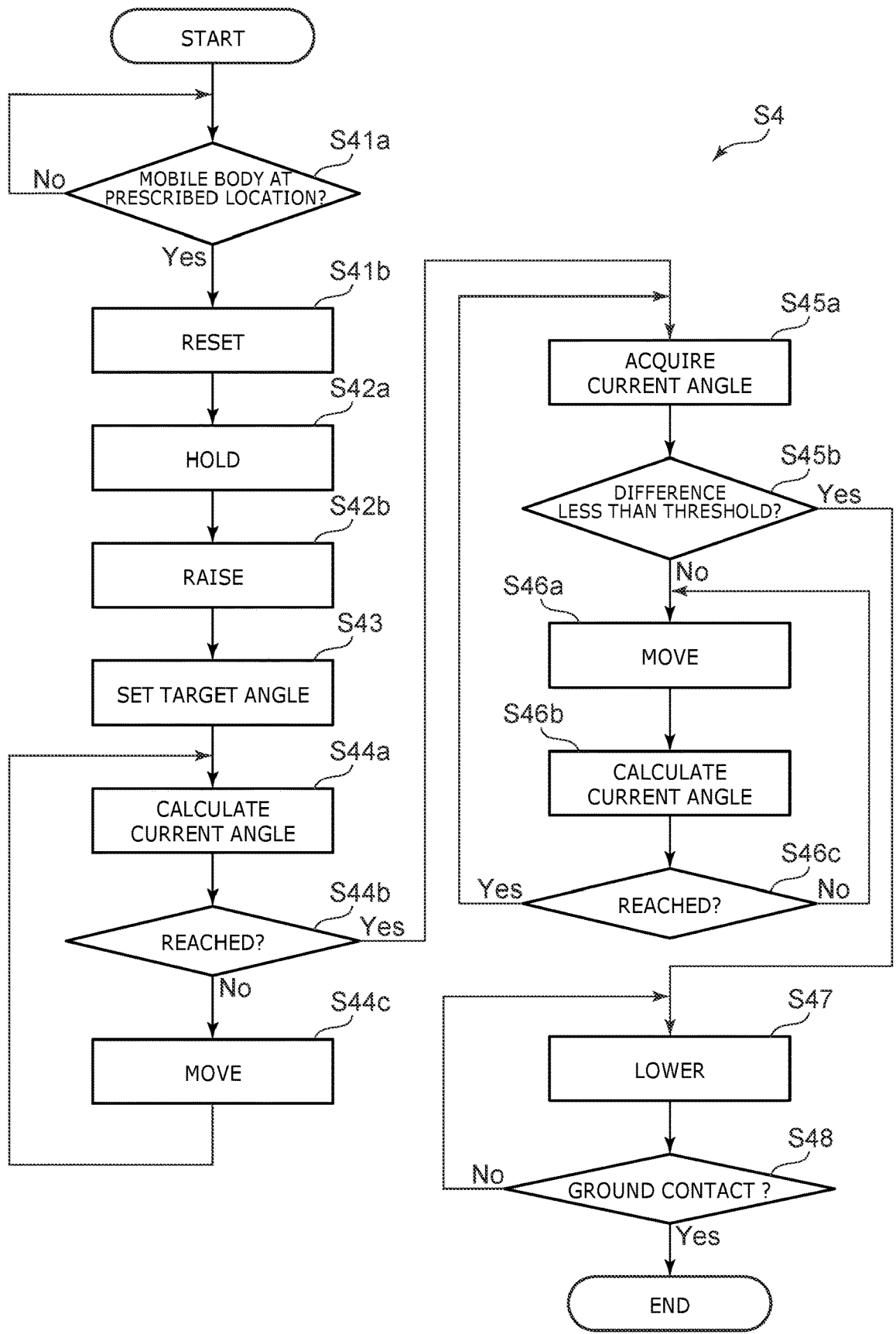
FIG. 18 is a flowchart that elaborates step S4 of FIG. 15.

FIG. 18 is a flowchart that elaborates step S4 of FIG. 15.

The detector 173 detects that the position in the first direction D1 of the mobile body 200 is at a prescribed position with respect to the holding mechanism 110. While the mobile body 200 moves toward the holding apparatus 100, the controller 190 determines whether or not the mobile body 200 has reached the prescribed position based on the detection result of the detector 173 (step S41a). When the mobile body 200 reaches the prescribed position, a signal is transmitted from the controller 190 to the controller 290; and the mobile body 200 stops. The controller 290 resets the current position of the mobile body 200 (step S41b). The current position is the position in the first direction D1 of the mobile body 200 that was calculated based on the measurement result of the measuring instrument 261 in the inspection of the previous step S2. By resetting the current position, the prescribed position described above is set as the origin position in the first direction D1 of the mobile body 200.

The holding mechanism 110 holds the mobile body 200 (step S42a). The raising/lowering mechanism 140 raises the holding mechanism 110 (step S42b). The holding mechanism 110 separates from the first and second structure bodies ST1 and ST2.

The holding mechanism 110 is moved along the circumferential direction CD by the operation of the movement mechanism 120. Specifically, the controller 190 accesses not-illustrated memory and acquires the angle around the first direction D1 of the part to be inspected. The controller 190 sets the angle as the target angle (step S43). The controller 190 calculates the current angle (step S44a). For example, the controller 190 calculates the current angle based on the movement amount measured by the measuring instrument 171 and the diameter of the second part P2. The controller 190 determines whether or not the holding mechanism 110 has reached the target angle (step S44b). For example, it is determined that the holding mechanism 110 has reached the target angle when the difference between the current angle and the target angle is less than a prescribed threshold. When the holding mechanism 110 has not reached the target angle, the controller 190 causes the movement mechanism 120 to move the holding mechanism 110 along the circumferential direction CD (step S44c).

When it is determined that the holding mechanism 110 has reached the target angle, the controller 190 acquires the tilt of the holding mechanism 110 detected by the detector 172 as the current angle (step S45a). The controller 190 compares the difference between the current angle and the target angle set in step S43 with a prescribed threshold (step S45b). When the difference is greater than the threshold, the controller 190 causes the movement mechanism 120 to move the holding mechanism 110 along the circumferential direction CD (step S46a). The controller 190 calculates the current angle based on the angle acquired in step S45a, the movement amount measured by the measuring instrument 171, and the diameter of the second part P2 (step S46b). The controller 190 determines whether or not the holding mechanism 110 has reached the target angle (step S46c). For example, it is determined whether or not the holding mechanism 110 has reached the target angle when the difference between the current angle and the target angle is less than a prescribed threshold.

When the difference is determined to be less than the threshold in step S45b, the raising/lowering mechanism 140 lowers the holding mechanism 110 (step S47). At this time, the controller 290 determines whether or not the ground contact of the mobile body 200 is detected by the detector 262 (step S48). The raising/lowering mechanism 140 lowers the holding mechanism 110 until the ground contact of the mobile body 200 is detected.

Figure 19:
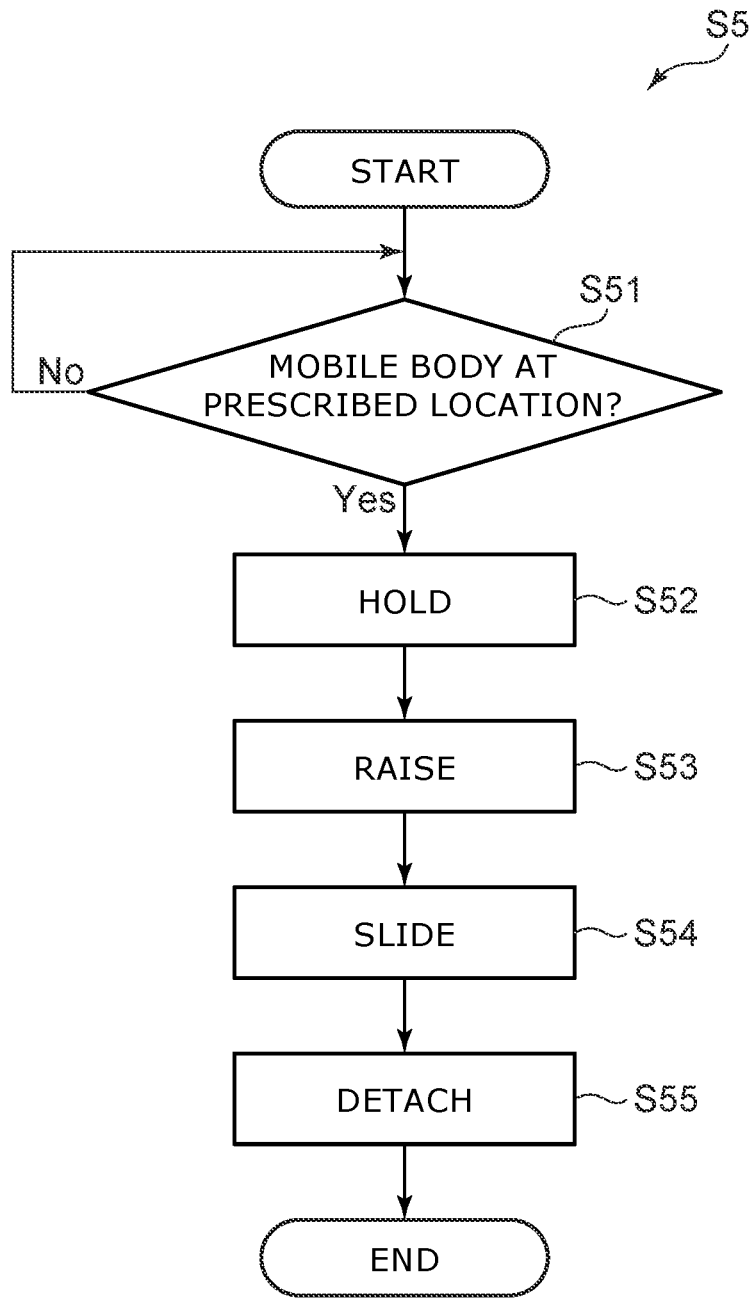
FIG. 19 is a flowchart that elaborates step S5 of FIG. 15.

FIG. 19 is a flowchart that elaborates step S5 of FIG. 15.

While the mobile body 200 moves toward the holding apparatus 100, the controller 190 determines whether or not the mobile body 200 has reached the prescribed position based on the detection result of the detector 173 (step S51). When the mobile body 200 reaches the prescribed position, a signal is transmitted from the controller 190 to the controller 290; and the mobile body 200 stops. The holding mechanism 110 holds the mobile body 200 (step S52). The raising/lowering mechanism 140 raises the holding mechanism 110 (step S53). The holding mechanism 110 separates from the first and second structure bodies ST1 and ST2. The sliding mechanism 150 slides toward the end portion side of the first structure body ST1 and moves the holding mechanism 110 (step S54). The human detaches the mobile body 200 from the holding apparatus 100 (step S55).

Figure 20:
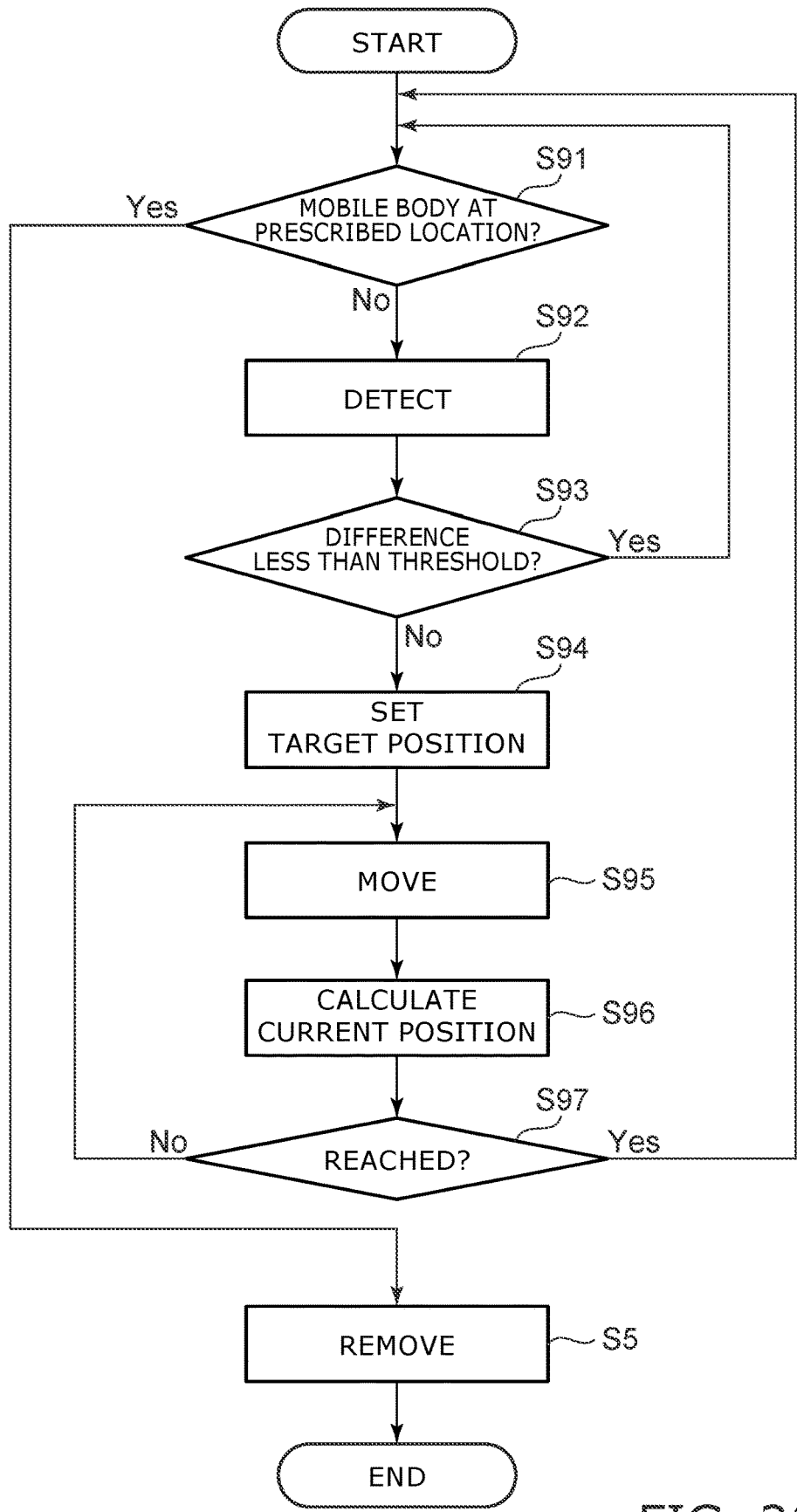
FIG. 20 is a flowchart illustrating an operation of the holding apparatus according to the embodiment.

FIG. 20 is a flowchart illustrating an operation of the holding apparatus according to the embodiment.

When an abnormality occurs in the mobile body 200, there is a possibility that the mobile body 200 may stop between the first structure body ST1 and the second structure body ST2. At this time, the raising/lowering plate 244 is urged toward one of the surfaces so that the mobile body 200 does not fall inside the gap G due to gravity. For example, when the mobile body 200 moves along the first surface SF1, the raising/lowering plate 244 is mechanically urged toward the second surface SF2. Thereby, the mobile body 200 can be prevented from falling even when an abnormality occurs in the electrical system or the communication system of the mobile body 200.

When the mobile body 200 is stopped inside the structure ST, for example, a human moves the mobile body 200 to the end of the structure ST by pulling the cable 225. Step S5 illustrated in FIGS. 15 and 19 is performed at this time so that the mobile body 200 is easily extracted from the structure ST. To perform step S5, it is necessary for the mobile body 200 to be retracted between the first holder 111 and the second holder 112.

The holding apparatus 100 adjusts the position in the circumferential direction CD of the holding mechanism 110 based on the detection result of the detector 174 so that the mobile body 200 is positioned between the first holder 111 and the second holder 112. Specifically, the following steps are performed.

While the mobile body 200 is being retracted, the controller 190 determines whether or not the mobile body 200 has reached the prescribed position based on the detection result of the detector 173 (step S91). Specifically, the detector 174 detects the position in the circumferential direction CD of the mobile body 200 with respect to the holding mechanism 110 (step S92). The controller 190 determines whether or not the difference between the detected position and the prescribed reference position is less than a prescribed threshold (step S93).

When the difference is greater than the threshold, the controller 290 sets the reference position as the target position by using the position of the detected mobile body 200 as the starting point (step S94). The controller 190 causes the movement mechanism 120 to move the holding mechanism 110 along the circumferential direction CD (step S95). The controller 190 calculates the current position based on the movement amount measured by the measuring instrument 171 (step S96). The controller 190 determines whether or not the holding mechanism 110 has reached the target position (step S97). For example, it is determined that the holding mechanism 110 has reached the target position when the difference between the current position and the target position is less than a prescribed threshold.

Step S91 is re-performed when the difference is determined to be less than the threshold in step S93 and when it is determined that the holding mechanism 110 has reached the target position in step S97. When it is determined that the mobile body 200 has reached the prescribed position in step S91, step S5 for removing the mobile body 200 is performed.

For example, the structure ST is a generator. The first structure body ST1 is a rotor. The second structure body ST2 is a stator. The hole H is a vent hole provided in the rotor. The mobile body 200 inspects for abnormalities of the generator while moving between the rotor and the stator.

Effects of embodiments will now be described.

In the inspection described in reference to FIGS. 15 to 19, the mobile body 200 moves along the first direction D1. The movement in the circumferential direction CD of the mobile body 200 is performed by the holding apparatus 100. The position in the circumferential direction CD of the holding mechanism 110 can be calculated based on the measurement result of the measuring instrument 171. The measuring instrument 171 includes an encoder, an angular velocity sensor, etc., and acquires information necessary for measuring the movement amount at relatively short intervals. Thereby, for example, steps S22a to S22c illustrated in FIG. 17 can be completed in a shorter period of time.

On the other hand, the roller of an encoder may slip with respect to the first surface SF1 when rotating in contact with the first surface SF1. When slipping occurs, the movement amount of the holding mechanism 110 is detected to be less than the actual movement amount; and an error occurs. When an angular velocity sensor is used, the movement amount of the holding mechanism 110 that is measured may be different from the actual movement amount due to fluctuation of the sensitivity, etc. Accordingly, when the holding mechanism 110 is moved based on only the measurement result of the measuring instrument 171, there is a possibility that the position in the circumferential direction CD of the mobile body 200 may be shifted from the position in the circumferential direction CD of the part to be inspected. As a result, there is a possibility that the inspection of the structure ST cannot be correctly completed. In particular, in the case of a generator, mist-like oil is circulated through the generator interior to cool the rotor and the stator. When the oil is adhered to the second part P2, the rollers slip even more easily. In such a case, the error becomes even larger.

The holding apparatus 100 according to the embodiment includes the detector 172. Compared to the measuring instrument 171, the detector 172 more directly detects the tilt of the holding mechanism 110. The error of the measuring instrument 171 can be corrected by using the detector 172. Thereby, the position in the circumferential direction CD of the mobile body 200 can be more accurately aligned with the position in the circumferential direction CD of the part to be inspected.

The position in the circumferential direction CD of the holding mechanism 110 may be adjusted based on only the detection result of the detector 172. However, the interval of the detection by the detector 172 is greater than the interval of the measurement by the measuring instrument 171. Therefore, the time that is necessary to adjust the position is long compared to when the measuring instrument 171 and the detector 172 are used. To reduce the inspection time, it is favorable for both the measuring instrument 171 and the detector 172 to be provided in the holding apparatus 100.

Similarly to the measuring instrument 171, the measuring instrument 261 may include an encoder. Therefore, a roller of the encoder may slip with respect to the first surface SF1 or the second surface SF2. There is a possibility that the position in the first direction D1 of the mobile body 200 may be shifted from the position in the first direction D1 of the hole H to be inspected. For this problem, the mobile body 200 corrects the position in the first direction D1 based on the image of the imager 263 as illustrated in steps S23 to S26c of FIG. 17. The hole H can be more accurately inspected thereby.

It is favorable for the holding apparatus 100 to include the detector 173. The detector 173 detects when the position in the first direction D1 of the mobile body 200 is at the prescribed position with respect to the holding mechanism 110. By moving the mobile body 200 to the prescribed position based on the detection result of the detector 173, the holding mechanism 110 can hold the mobile body 200 more stably. By moving the mobile body 200 along the first direction D1 by using the prescribed position as the reference, the mobile body 200 can be more accurately moved to the position at which the hole H is located. For example, it is difficult to correct the position of the mobile body 200 based on the image acquired by the imager 263 when the hole H is not visible in the image. By using the detector 173, the error between the position in the first direction D1 of the mobile body 200 and the position in the first direction D1 of the hole H can be reduced, and the likelihood of the hole H being outside the imaging range can be reduced.

It is favorable for the holding apparatus 100 to include the detector 174. The detector 174 detects the position in the circumferential direction CD of the mobile body 200 with respect to the holding mechanism 110. By using the detector 174, the holding mechanism 110 can be moved with the mobile body 200 even when the position in the circumferential direction CD of the mobile body 200 is shifted from the position in the circumferential direction CD of the holding mechanism 110. For example, even when a human retracts the mobile body 200 from outside the structure ST, the holding mechanism 110 can be moved with the mobile body 200; and the mobile body 200 can be held by the holding mechanism 110.

It is favorable for the mobile body 200 to include the detector 262. The detector 262 detects the ground contact of the mobile body 200. By using the detector 262, when the raising/lowering mechanism 140 lowers the mobile body 200, the raising/lowering mechanism 140 can be stopped when the ground contact of the mobile body 200 is detected. For example, the likelihood of the holding apparatus 100, the mobile body 200, or the structure ST being damaged due to the mobile body 200 being strongly pressed onto the first structure body ST1 or the second structure body ST2 can be reduced thereby. By using the detector 262, the mobile body 200 can be more safely grounded even when the difference between the lengths in the diametrical direction RD of the first and second parts P1 and P2 or the distance in the diametrical direction RD between the second part P2 and the second surface SF2 is unknown.

The detector 262 may be located in the holding apparatus 100 instead of the mobile body 200. For example, the detector 262 is located in the holding mechanism 110 and includes a switch for detecting the ground contact of the holding mechanism 110. For example, the switch is pressed when the holding mechanism 110 is lowered and the mobile body 200 reaches the ground contact position. The controller 190 stops the raising/lowering mechanism 140 when the ground contact of the mobile body 200 is detected by the detector 262. In such a case as well, effects similar to when the mobile body 200 includes the detector 262 can be obtained. For example, the likelihood of damage of the holding apparatus 100, the mobile body 200, or the structure ST can be reduced.

According to embodiments as described above, the performance of the holding apparatus 100, the mobile body 200, or the inspection system can be improved. The improvement of the performance includes, for example, at least one of an increase of the positional accuracy of the holding mechanism 110, an increase of the positional accuracy of the mobile body 200, an increase of the inspection accuracy, the suppression of the damage of the holding apparatus 100, the suppression of the damage of the mobile body 200, or the suppression of the damage of the structure ST. According to the method for moving the mobile body 200 and the method for holding the mobile body 200 described above, at least one of an increase of the positional accuracy of the holding mechanism 110, an increase of the positional accuracy of the mobile body 200, or the suppression of the damage of the mobile body 200 can be realized.

An example is described above in which the holding apparatus 100 and the mobile body 200 are located in a gap between the first structure body ST1 and the second structure body ST2. Applications are not limited to the example; the holding apparatus 100 and the mobile body 200 are applicable to a structure ST that does not include the second structure body ST2 and includes only the first structure body ST1. The holding apparatus 100 is located on the first surface SF1; and the mobile body 200 moves on the first surface SF1. In such a case as well, the performance of the holding apparatus 100, the mobile body 200, or the inspection system can be improved.

For example, the processing of the various data described above is executed based on a program (software). For example, the processing of the various information recited above is performed by the controllers 190 and 290 reading the program.

The processing of the various information recited above may be recorded, as a program that can be executed by a computer, in a magnetic disk (a flexible disk, a hard disk, etc.), an optical disk (CD-ROM, CD-R, CD-RW, DVD-ROM, DVD±R, DVD±RW, etc.), semiconductor memory, or another recording medium (non-transitory computer-readable storage medium).

For example, information that is recorded in the recording medium can be read by a computer (or an embedded system). The recording format (the storage format) of the recording medium is arbitrary. For example, the computer reads the program from the recording medium and causes the CPU to execute the instructions recited in the program based on the program. In the computer, the acquisition (or the reading) of the program may be performed via a network.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. The above embodiments can be practiced in combination with each other.

What is claimed is:

1. A holding apparatus, comprising:
    a holding mechanism holding a mobile body, the mobile body being movable through a gap between a first structure body and a second structure body, the first structure body being columnar and extending in a first direction, the second structure body being tubular and being located around the first structure body along a first plane perpendicular to the first direction;
    a movement mechanism moving the holding mechanism along a circumferential direction around the first direction;
    a first measuring instrument measuring a movement amount in the circumferential direction of the holding mechanism;
    a first detector detecting a tilt of the holding mechanism in the first plane; and
    a first controller operating the movement mechanism and moving the holding mechanism based on a measurement result of the first measuring instrument and a detection result of the first detector.

2. A holding apparatus, comprising:
    a holding mechanism holding a mobile body on a first structure body, the mobile body being movable, the first structure body being columnar and extending in a first direction;
    a movement mechanism moving the holding mechanism along a circumferential direction around the first direction;
    a first measuring instrument measuring a movement amount in the circumferential direction of the holding mechanism;
    a first detector detecting a tilt of the holding mechanism in a first plane perpendicular to the first direction; and
    a first controller operating the movement mechanism and moving the holding mechanism based on a measurement result of the first measuring instrument and a detection result of the first detector.

3. The apparatus according to claim 1, wherein the first controller
moves the holding mechanism to a target angle while calculating an angle in the circumferential direction of the holding mechanism based on the measurement result of the first measuring instrument,
determines whether or not the holding mechanism is at the target angle based on the detection result of the first detector, and
moves the holding mechanism further toward the target angle when the holding mechanism is not at the target angle.

4. The apparatus according to claim 1, further comprising:
a second detector detecting movement of the mobile body to a prescribed position with respect to the holding mechanism.

5. The apparatus according to claim 4, wherein
the first controller operates the holding mechanism to hold the mobile body when the movement to the prescribed position of the mobile body is detected by the second detector.

6. The apparatus according to claim 1, further comprising:
a third detector detecting a position in the circumferential direction of the mobile body with respect to the holding mechanism.

7. The apparatus according to claim 6, wherein
the first controller moves the holding mechanism based on a detection result of the third detector to cause the holding mechanism to be arranged with the mobile body in the first direction.

8. The apparatus according to claim 1, further comprising:
a mounting part connected to the holding mechanism and wound around the first structure body along the circumferential direction,
the holding mechanism being mounted to the first structure body via the mounting part.

9. The apparatus according to claim 8, wherein the mounting part further includes:
the movement mechanism that is separated from the holding mechanism;
a first coupler coupling the movement mechanism and the holding mechanism, the first coupler being band-shaped; and
a second coupler coupling the movement mechanism and the holding mechanism, the second coupler being band-shaped,
the movement mechanism, the first coupler, and the second coupler being located around a portion of the first structure body along the first plane.

10. The apparatus according to claim 1, further comprising:
a raising/lowering mechanism moving the holding mechanism along a diametrical direction perpendicular to the first direction and the circumferential direction.

11. The apparatus according to claim 10, wherein
the first controller moves the holding mechanism by operating the movement mechanism in a state in which the holding mechanism is separated from the first structure body by the raising/lowering mechanism.

12. The apparatus according to claim 10, further comprising:
a fourth detector detecting a ground contact of the holding mechanism,
when the first controller lowers the holding mechanism, the holding mechanism is lowered until the ground contact of the holding mechanism is detected by the fourth detector.

13. An inspection system, comprising:
the apparatus according to claim 10; and
the mobile body,
the mobile body including a fourth detector detecting a ground contact,
when the first controller lowers the holding mechanism, the holding mechanism is lowered until the ground contact of the mobile body is detected by the fourth detector.

14. The apparatus according to claim 1, wherein
the first structure body includes a first part, and a second part arranged with the first part in the first direction,
a length of the second part in a diametrical direction is greater than a length of the first part in the diametrical direction,
the diametrical direction is perpendicular to the first direction and the circumferential direction,
the apparatus is mounted to the second part, and
the holding mechanism holds the mobile body on the first part.

15. The apparatus according to claim 14, further comprising:
a frame mounted to the first structure body,
the holding mechanism and the movement mechanism being connected to the frame,
the frame including
a first roller catching on a step between the first part and the second part, and
a second roller separated from the first roller in the first direction,
a portion of the second part being interposed between the first roller and the second roller.

16. The apparatus according to claim 15, wherein
the frame further includes a sliding part moving the second roller along the first direction, and
the first roller and the second roller are rotatable around the first direction.

17. The apparatus according to claim 1, wherein
the first structure body is a rotor of a generator.

18. A movement method, comprising:
holding a mobile body and moving the mobile body along a circumferential direction around a first direction, the mobile body being movable through a gap between a first structure body and a second structure body, the first structure body being columnar and extending in the first direction, the second structure body being tubular and being located around the first structure body along a first plane perpendicular to the first direction;
measuring a movement amount in the circumferential direction and detecting a tilt in the first plane when moving; and
moving the mobile body based on a measurement result of the movement amount and a detection result of the tilt.

19. A movement method, comprising:
holding a mobile body and moving the mobile body along a circumferential direction around a first direction, the mobile body being movable on a first structure body, the first structure body being columnar and extending in the first direction;
measuring a movement amount in the circumferential direction and detecting a tilt in a first plane perpendicular to the first direction when moving; and moving the mobile body based on a measurement result of the movement amount and a detection result of the tilt.

20. The method according to claim 18, wherein the moving includes:
- moving the mobile body to a target angle while calculating an angle in the circumferential direction of the mobile body based on the measurement result of the movement amount;
- determining whether or not the mobile body is at the target angle based on the detection result of the tilt; and
- moving the mobile body further toward the target angle when the mobile body is not at the target angle.

* * * * *